(12) United States Patent
Masuoka et al.

(10) Patent No.: US 9,614,075 B2
(45) Date of Patent: Apr. 4, 2017

(54) SEMICONDUCTOR DEVICE

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Peninsula Plaza (SG)

( * ) Notice: Subject to any disclaimer, the term of this patent is extended or adjusted under 35 U.S.C. 154(b) by 16 days.

(21) Appl. No.: 14/061,082

(22) Filed: Oct. 23, 2013

(65) Prior Publication Data
US 2014/0042504 A1 Feb. 13, 2014

Related U.S. Application Data

(62) Division of application No. 13/666,445, filed on Nov. 1, 2012, now Pat. No. 8,759,178.
(Continued)

(51) Int. Cl.
  *H01L 29/78* (2006.01)
  *H01L 21/8234* (2006.01)
  (Continued)

(52) U.S. Cl.
  CPC .... *H01L 29/7827* (2013.01); *H01L 21/26513* (2013.01); *H01L 21/3081* (2013.01);
  (Continued)

(58) Field of Classification Search
  CPC .......................................................... H01L 29/78
  (Continued)

(56) References Cited

U.S. PATENT DOCUMENTS 5,382,816 A   1/1995 Mitsui
6,300,198 B1  10/2001 Aeugle et al.
(Continued)

FOREIGN PATENT DOCUMENTS

CN    1251207      4/2000
JP    02-071556    3/1990
(Continued)

OTHER PUBLICATIONS

International Search Report for PCT/JP2012/062597 (including English Translation), dated Aug. 21, 2012, 3 pages.
(Continued)

*Primary Examiner* — Kenneth Parker
*Assistant Examiner* — Christopher Culbert
(74) *Attorney, Agent, or Firm* — Brinks Gilson & Lione

(57) ABSTRACT

A semiconductor device includes a fin-shaped silicon layer on a silicon substrate, and a first insulating film around the fin-shaped silicon layer. A pillar-shaped silicon layer is on the fin-shaped silicon layer, where a pillar diameter of the pillar-shaped silicon layer is equal to a fin width of the fin-shaped silicon layer, and where the pillar diameter and the fin width parallel to the surface. A first diffusion layer is in an upper portion of the fin-shaped silicon layer and a lower portion of the pillar-shaped silicon layer, and a second diffusion layer is in an upper portion of the pillar-shaped silicon layer. A gate insulating film is around the pillar-shaped silicon layer and a metal gate electrode is around the gate insulating film. A metal gate wiring is connected to the metal gate electrode and a contact is on the second diffusion layer.

4 Claims, 42 Drawing Sheets

Related U.S. Application Data

(60) Provisional application No. 61/557,501, filed on Nov. 9, 2011.

(51) Int. Cl.

| | | |
|---|---|---|
| *H01L 21/8238* | (2006.01) | |
| *H01L 29/423* | (2006.01) | |
| *H01L 29/66* | (2006.01) | |
| *H01L 21/265* | (2006.01) | |
| *H01L 21/308* | (2006.01) | |
| *H01L 29/08* | (2006.01) | |
| *H01L 29/10* | (2006.01) | |
| *H01L 29/45* | (2006.01) | |

(52) U.S. Cl.
CPC ........ *H01L 21/823431* (2013.01); *H01L 21/823487* (2013.01); *H01L 21/823821* (2013.01); *H01L 21/823885* (2013.01); *H01L 29/0847* (2013.01); *H01L 29/1037* (2013.01); *H01L 29/4238* (2013.01); *H01L 29/42372* (2013.01); *H01L 29/456* (2013.01); *H01L 29/66545* (2013.01); *H01L 29/66666* (2013.01); *H01L 29/66787* (2013.01); *H01L 29/78* (2013.01)

(58) Field of Classification Search
USPC .................................................. 258/328
See application file for complete search history.

(56) References Cited

U.S. PATENT DOCUMENTS

| | | | |
|---|---|---|---|
| 6,461,900 B1 | 10/2002 | Sundaresan et al. | |
| 6,642,575 B1 | 11/2003 | Ono et al. | |
| 6,747,314 B2 | 6/2004 | Sundaresan et al. | |
| 7,115,476 B1 | 10/2006 | Izumida | |
| 7,262,089 B2 | 8/2007 | Abbott et al. | |
| 7,304,343 B2 | 12/2007 | Masuoka et al. | |
| 7,348,243 B2 | 3/2008 | Kim | |
| 7,442,976 B2 | 10/2008 | Juengling | |
| 7,482,229 B2 | 1/2009 | Juengling | |
| 7,683,428 B2 | 3/2010 | Chidambarrao et al. | |
| 8,080,458 B2 | 12/2011 | Masuoka et al. | |
| 2003/0075758 A1 | 4/2003 | Sundaresan et al. | |
| 2003/0122200 A1* | 7/2003 | Kamiya .............. | H01L 23/5256 257/379 |
| 2005/0142771 A1 | 6/2005 | Kim | |
| 2005/0224847 A1 | 10/2005 | Masuoka et al. | |
| 2006/0046407 A1 | 3/2006 | Juengling | |
| 2006/0258109 A1 | 11/2006 | Juengling | |
| 2007/0257277 A1 | 11/2007 | Takeda et al. | |
| 2008/0061370 A1 | 3/2008 | Matsuo | |
| 2008/0136030 A1 | 6/2008 | Chang et al. | |
| 2008/0173936 A1 | 7/2008 | Yoon et al. | |
| 2009/0042347 A1 | 2/2009 | Oyu | |
| 2009/0078993 A1 | 3/2009 | Fujimoto | |
| 2009/0096000 A1 | 4/2009 | Juengling | |
| 2009/0200604 A1 | 8/2009 | Chidambarrao et al. | |
| 2010/0264485 A1* | 10/2010 | Masuoka et al. ............. | 257/329 |
| 2011/0049629 A1 | 3/2011 | Ishikawa et al. | |
| 2011/0068401 A1 | 3/2011 | Izumida et al. | |
| 2011/0104862 A1 | 5/2011 | Kadoya | |
| 2013/0140627 A1 | 6/2013 | Masuoka et al. | |
| 2013/0153989 A1 | 6/2013 | Masuoka et al. | |

FOREIGN PATENT DOCUMENTS

| | | |
|---|---|---|
| JP | 02-145761 | 6/1990 |
| JP | 02-188966 | 7/1990 |
| JP | 03-145761 | 6/1991 |
| JP | 06-021389 | 1/1994 |
| JP | 06-021467 | 1/1994 |
| JP | 07-245291 | 9/1995 |
| JP | 07-263677 | 10/1995 |
| JP | 08-227997 | 9/1996 |
| JP | 10-209407 A | 8/1998 |
| JP | 10-256510 | 9/1998 |
| JP | 11-297984 | 10/1999 |
| JP | 2001-284598 | 10/2001 |
| JP | 2003-179160 | 6/2003 |
| JP | 2005-197704 | 7/2005 |
| JP | 2006-108514 | 4/2006 |
| JP | 2006-310651 | 11/2006 |
| JP | 2006-351745 | 12/2006 |
| JP | 2007-520883 | 7/2007 |
| JP | 2007-528609 | 10/2007 |
| JP | 2007-329480 | 12/2007 |
| JP | 2008-511997 | 4/2008 |
| JP | 2008-140996 A | 6/2008 |
| JP | 2008-177565 | 7/2008 |
| JP | 2009-081163 | 4/2009 |
| JP | 2009-182317 | 8/2009 |
| JP | 2010-251586 | 11/2010 |
| JP | 2010-251678 | 11/2010 |
| JP | 2010-258345 | 11/2010 |
| JP | 2010-272874 A | 12/2010 |
| JP | 2011-086900 | 4/2011 |
| JP | 2011-187927 | 9/2011 |
| JP | 2011-258780 | 12/2011 |
| JP | 2012-004244 | 1/2012 |
| WO | WO 2005/079182 | 9/2005 |
| WO | WO 2006/028777 | 3/2006 |
| WO | WO 2009/102061 A1 | 8/2009 |

OTHER PUBLICATIONS

International Search Report for PCT/JP2012/062857 (including English Translation), dated Aug. 21, 2012, 3 pages.
Office Action for U.S. Appl. No. 13/289,742, dated Dec. 5, 2012, 13 pages.
Search Report and Written Opinion for Singapore Patent Application Serial No. 201108125-4, dated Oct. 5, 2012, 12 pages.
Extended European Search Report for European Application No. 10003947.8, dated Nov. 17, 2010, 9 pages.
Mistry et al., "A 45nm Logic Technology with High-k+Metal Gate Transistors, Strained Silicon, 9 Cu Interconnect Layers, 193nm Dry Patterning, and 100% Pb-free Packaging", *IEEE*, pp. 247-250, 2007.
Office Action from counterpart Chinese Application No. 201010167317.6, dated Nov. 24, 2011, 12 pages.
Wu et al., "High Performance 22/20nm FinFET CMOS Devices with Advanced High-K/Metal Gate Scheme", *IEEE*, pp. 27.1.1-27.1.4, 2010.
Notice of Allowance for U.S. Appl. No. 13/666,445 dated Apr. 9, 2014, 9 pages.

* cited by examiner

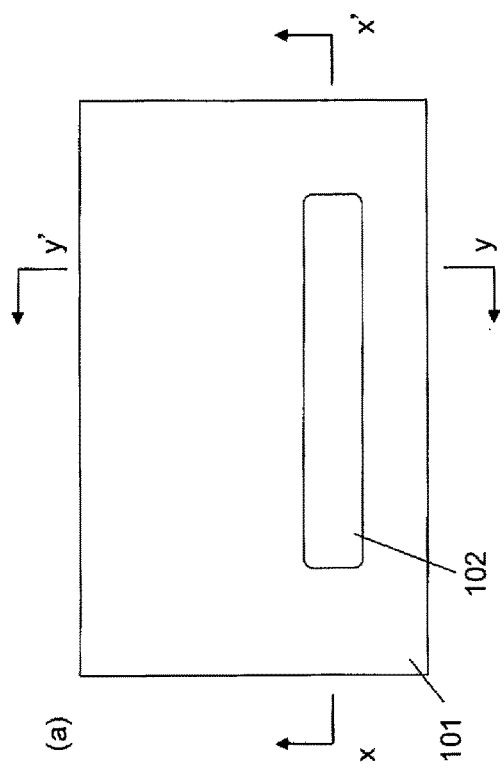
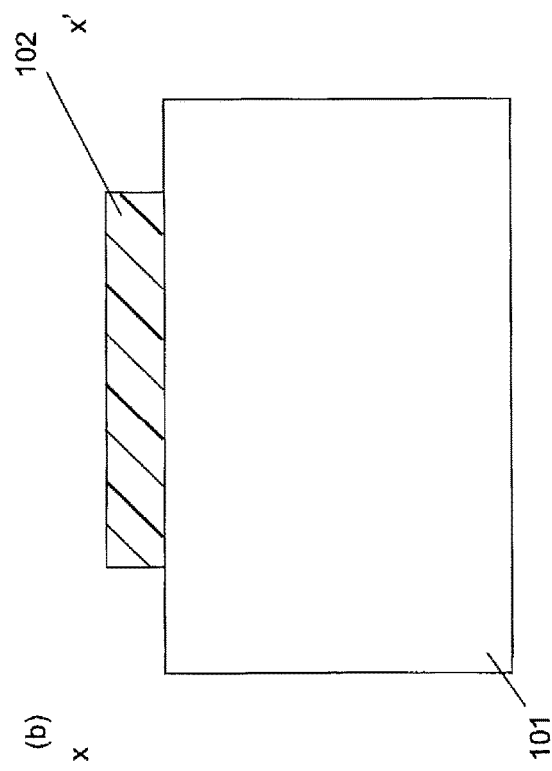
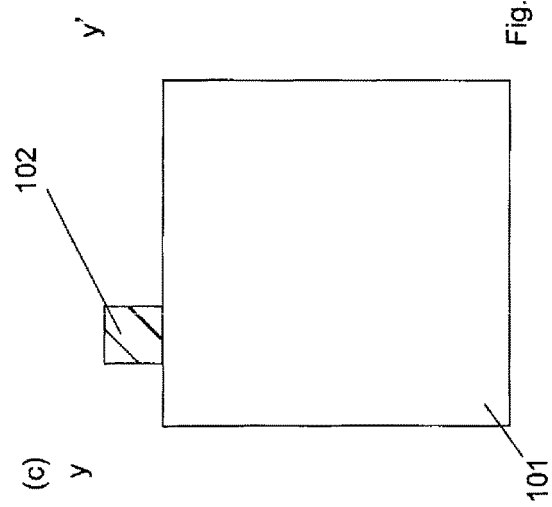
Fig.2

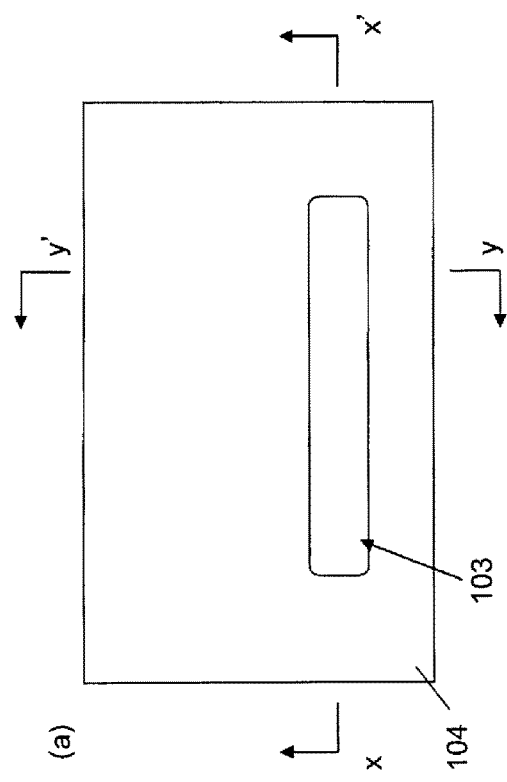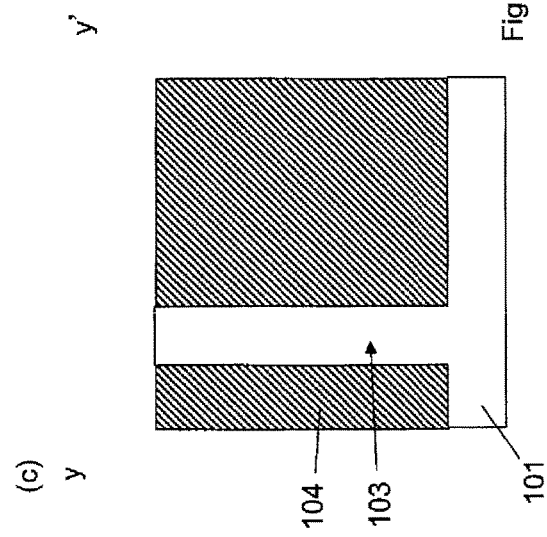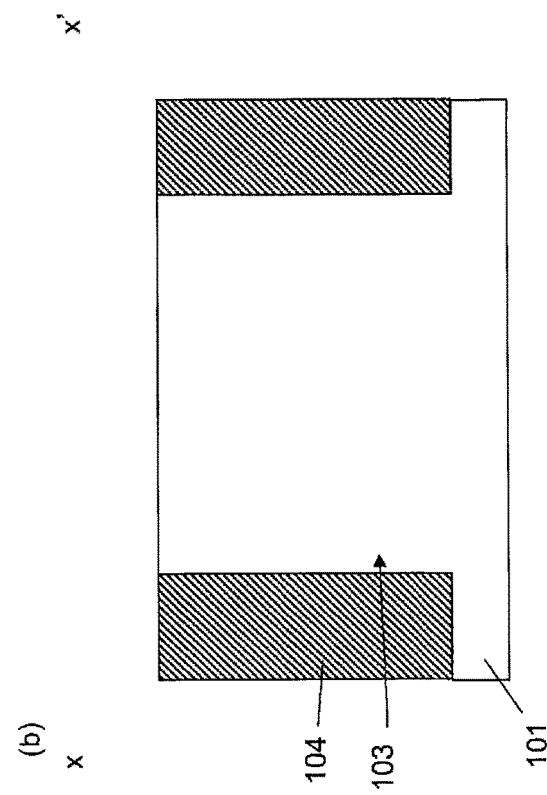
Fig.5

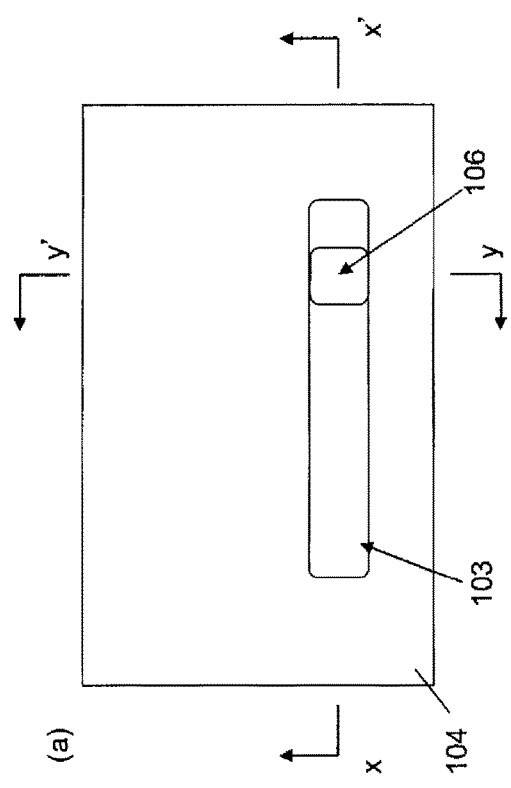
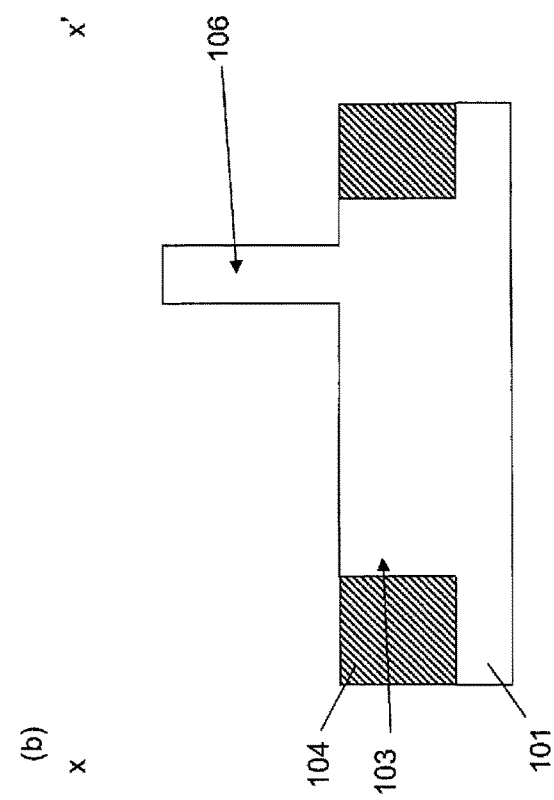
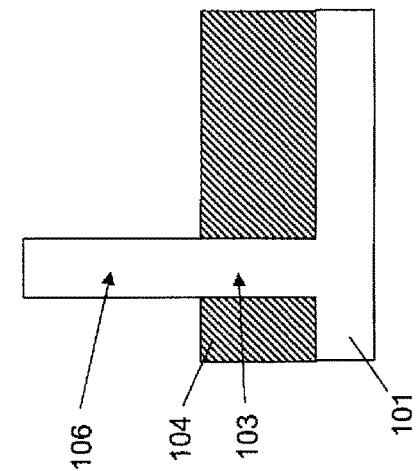
Fig. 9

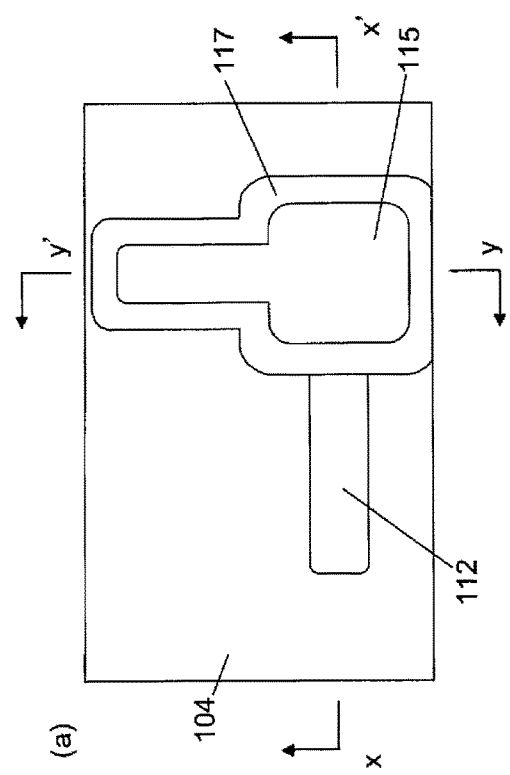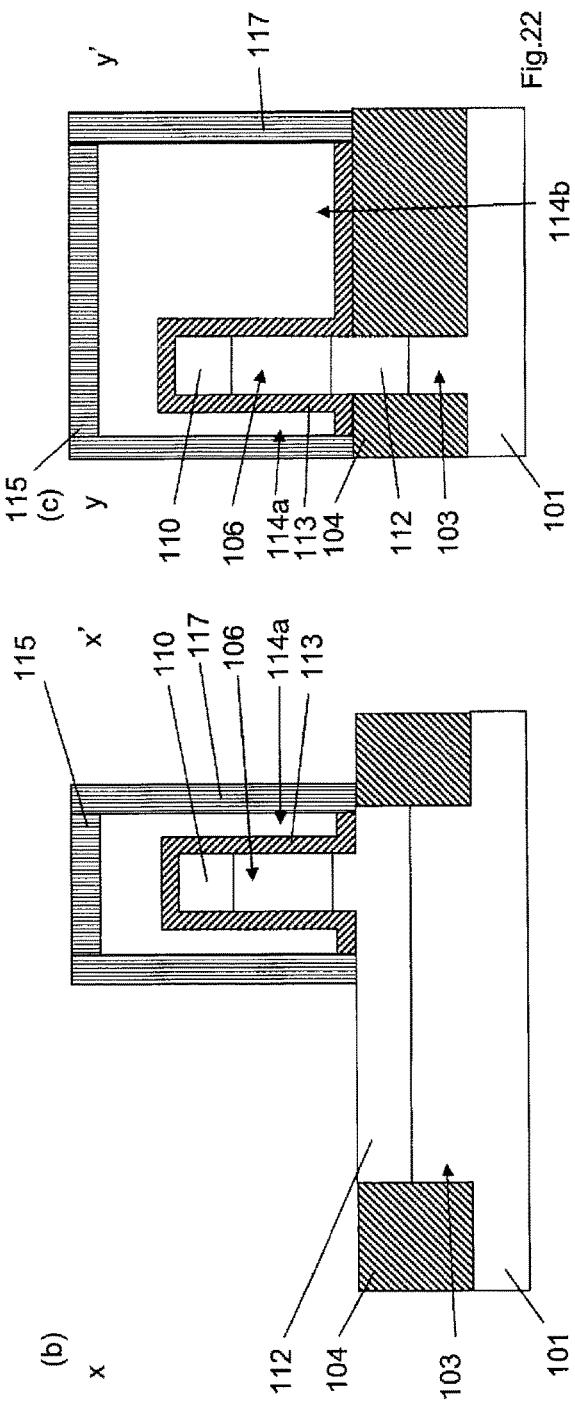
Fig. 22

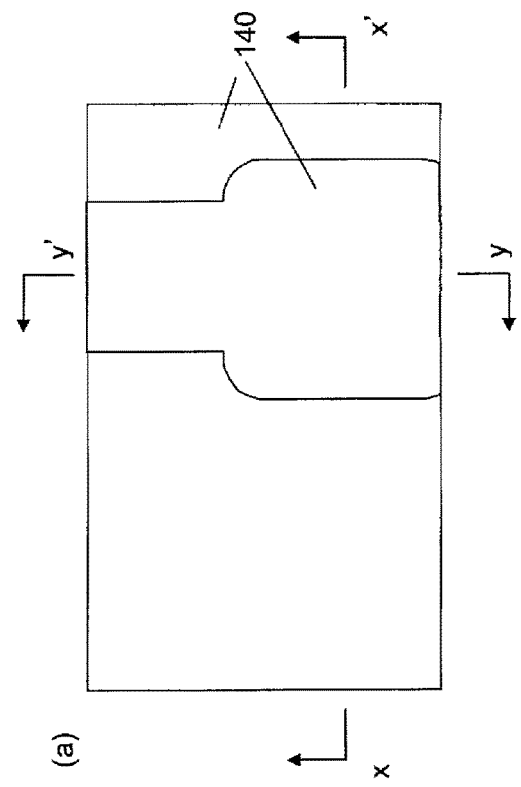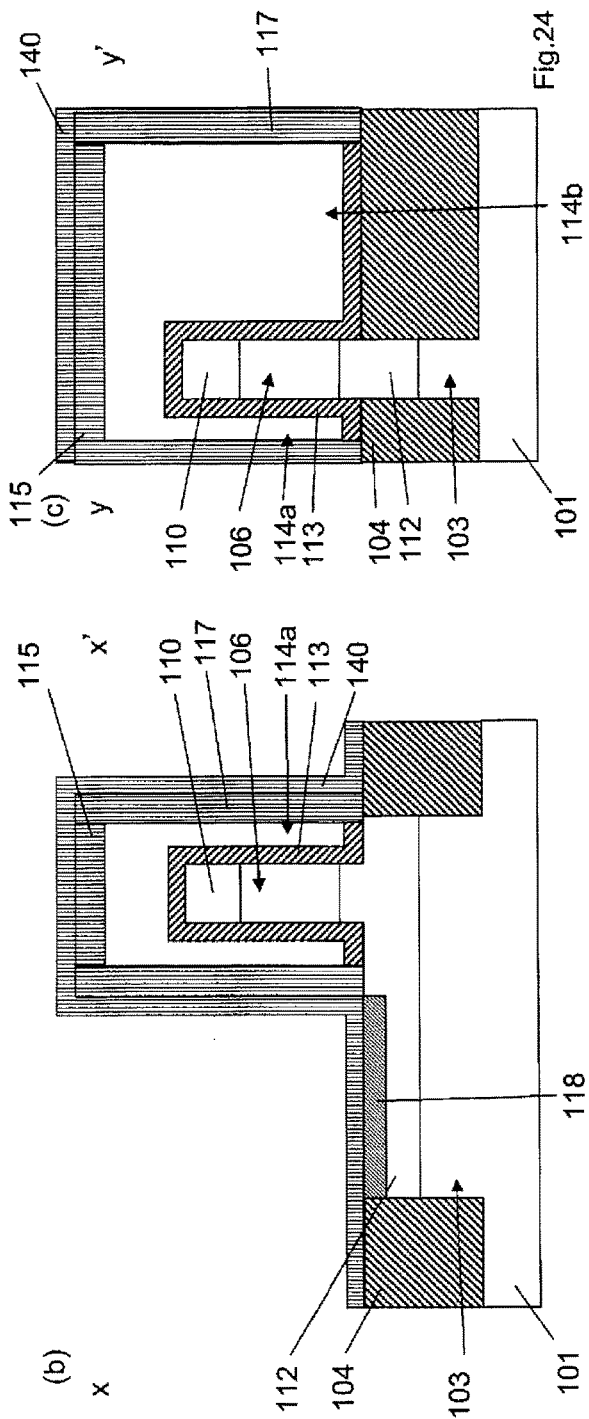
Fig.24

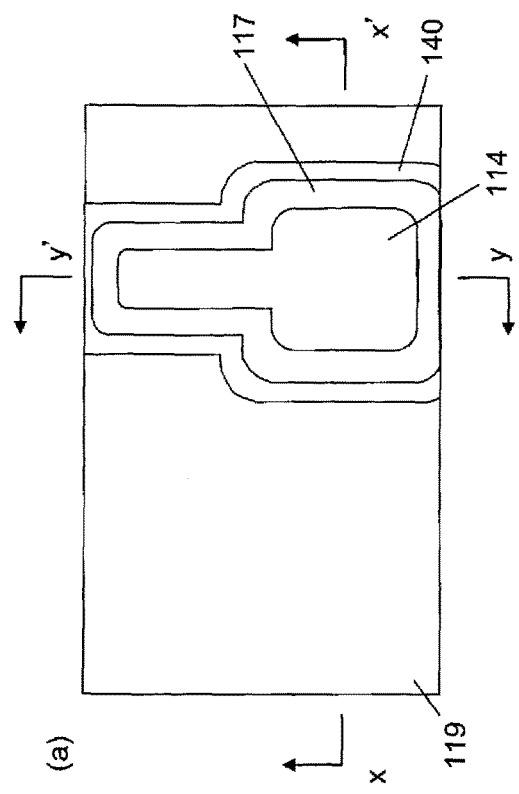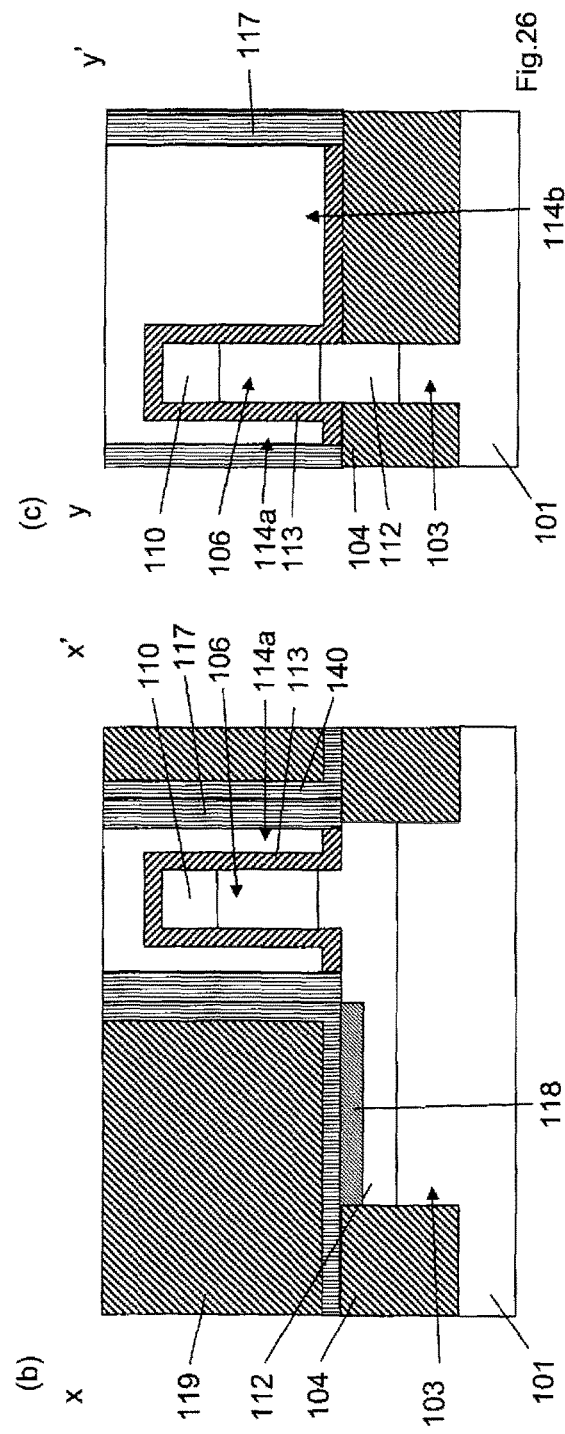

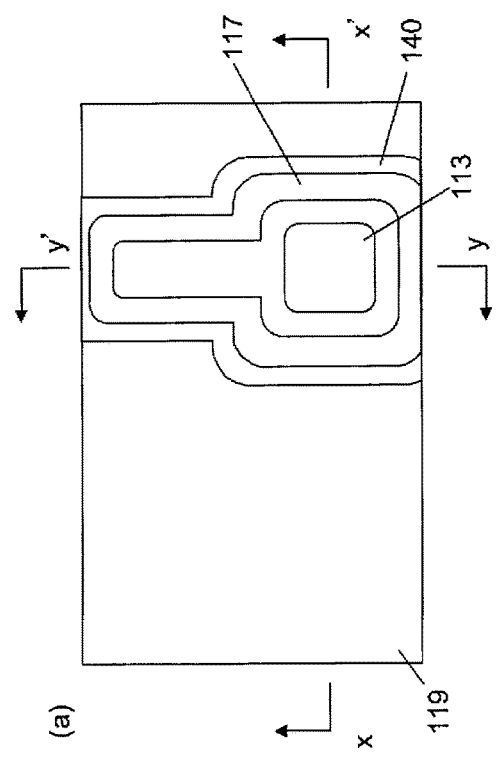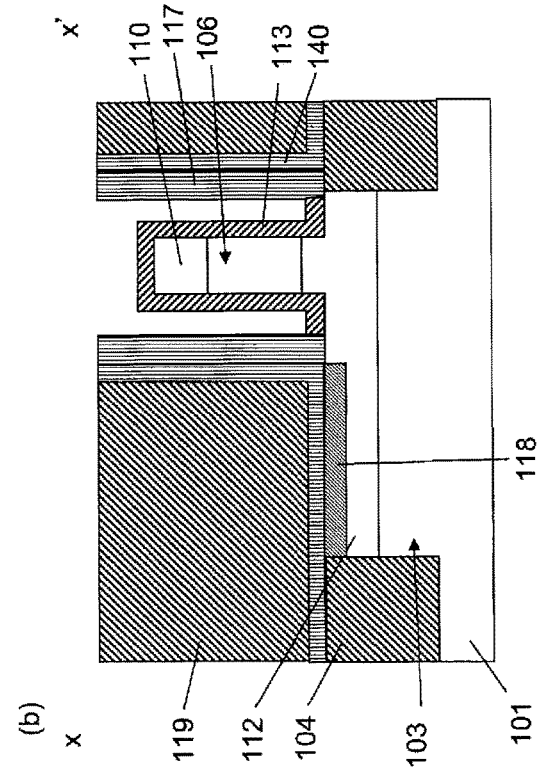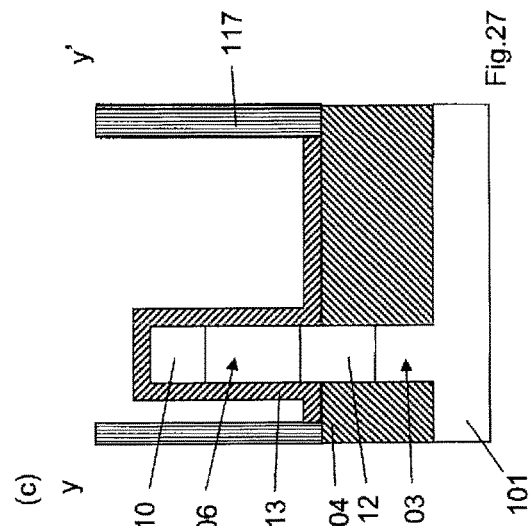
Fig.27

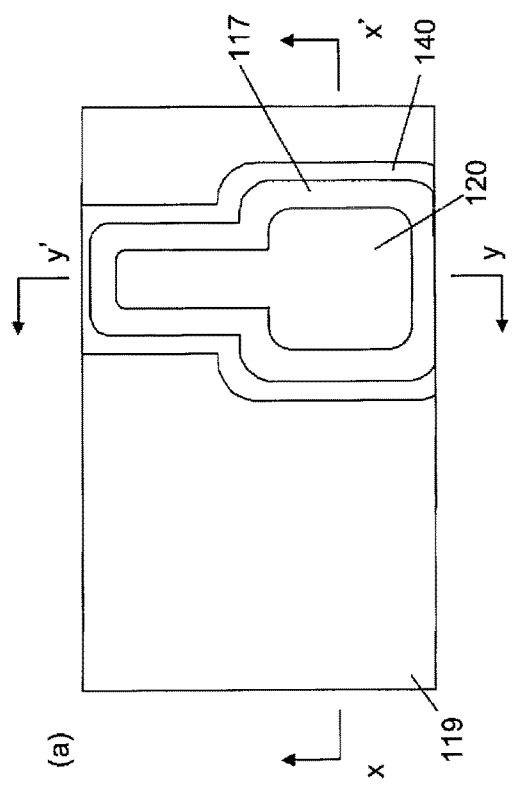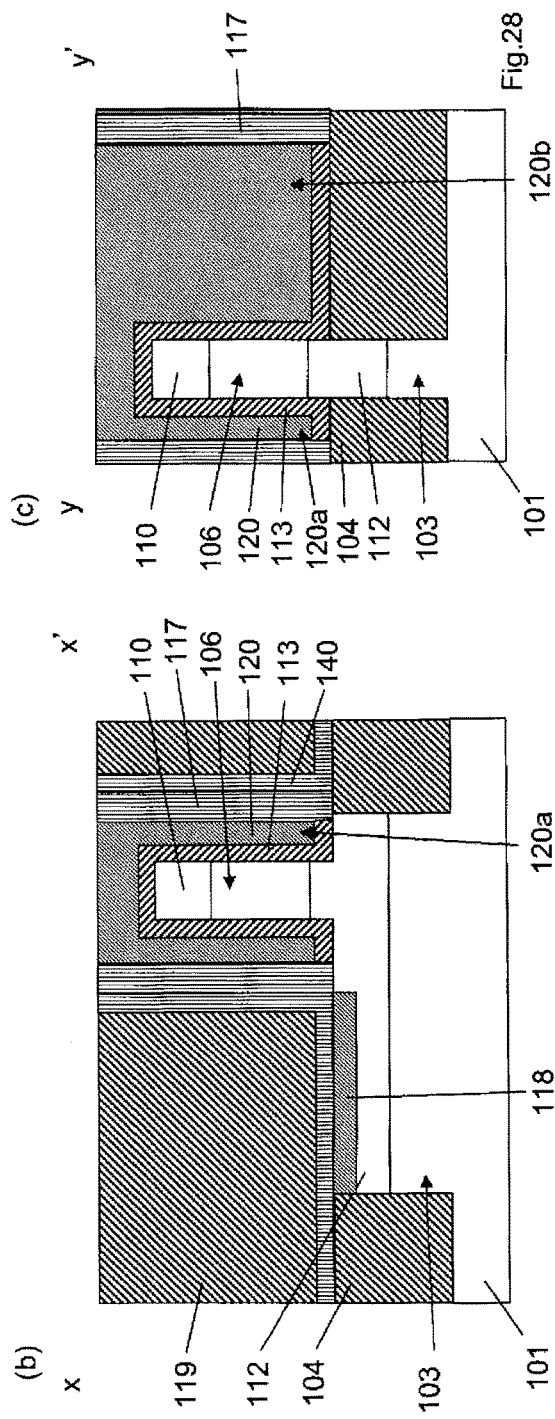
Fig.28

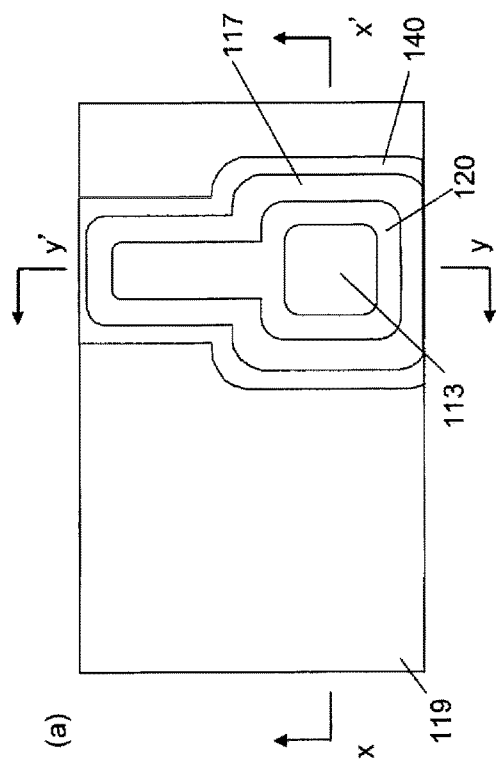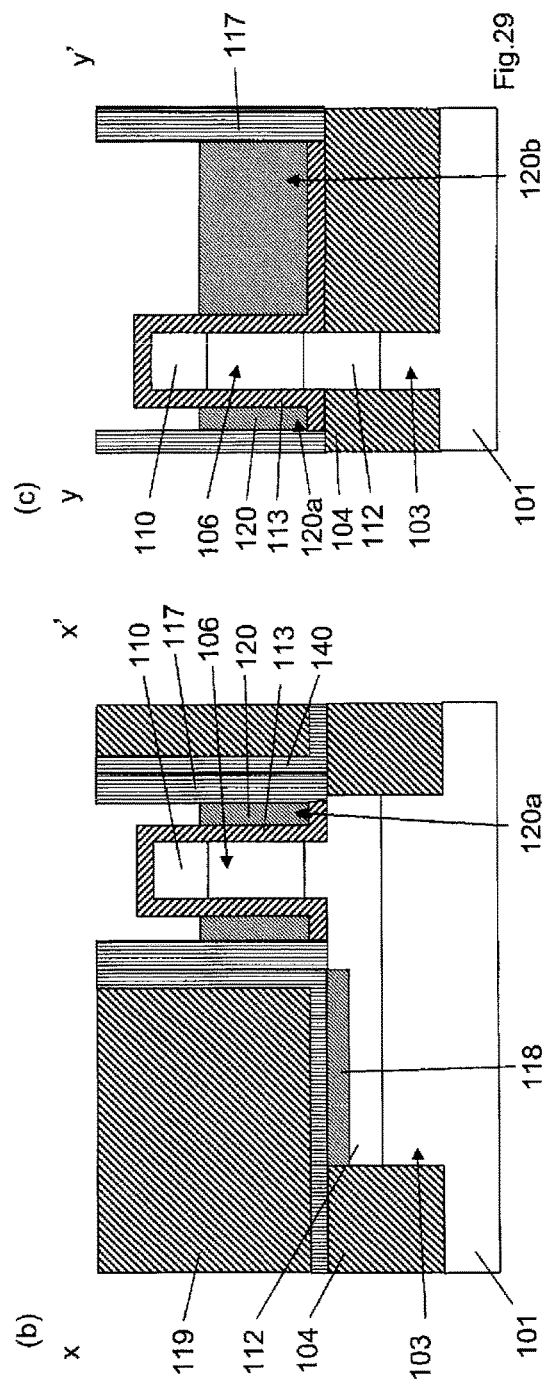
Fig. 29

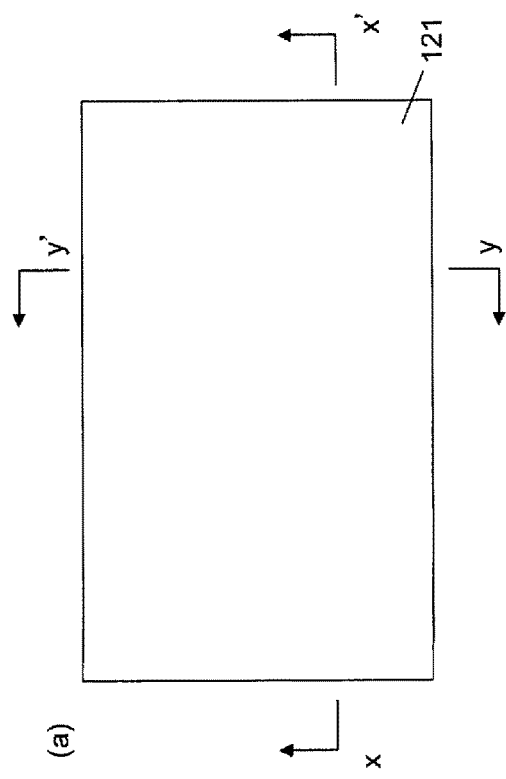
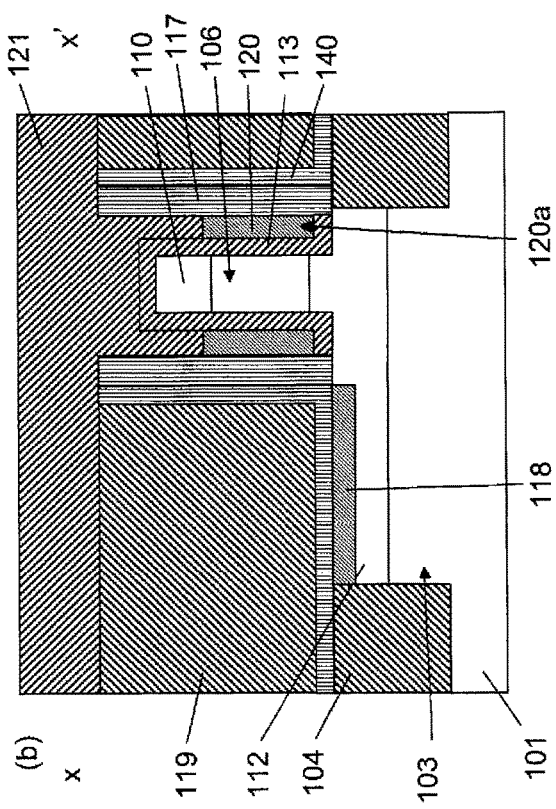
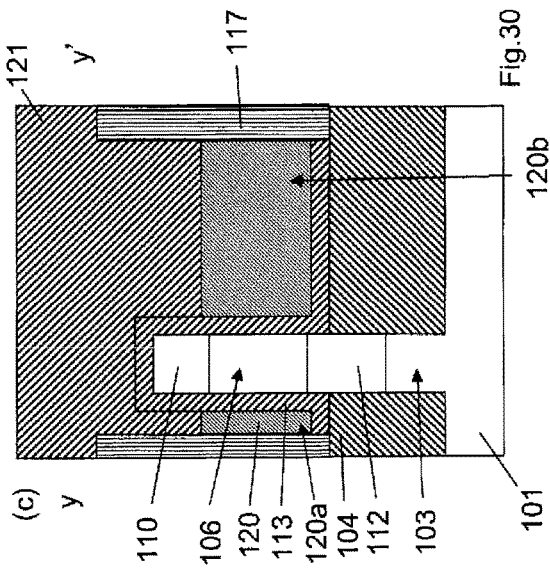
Fig. 30

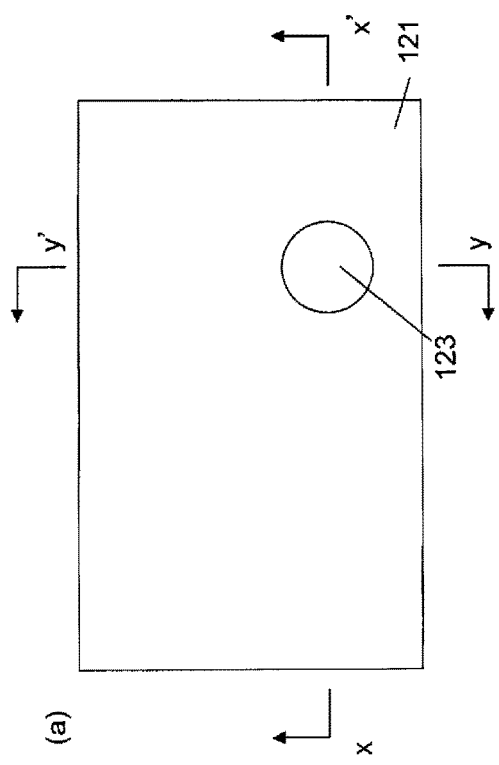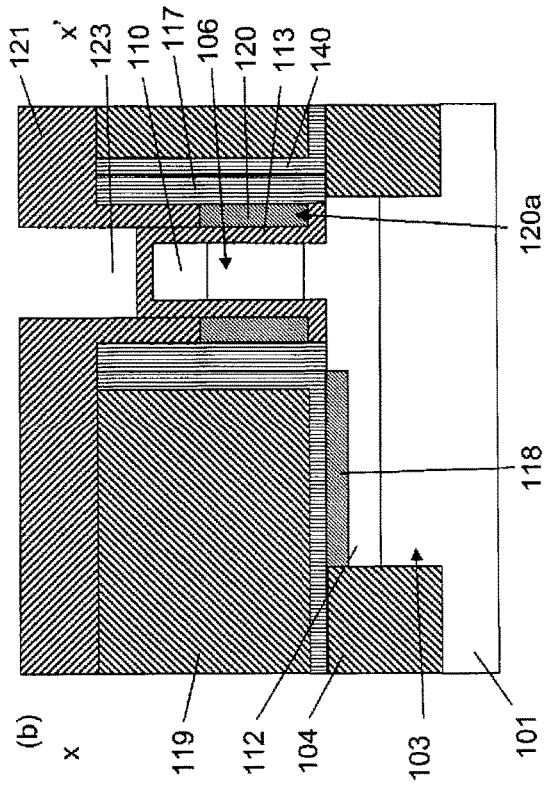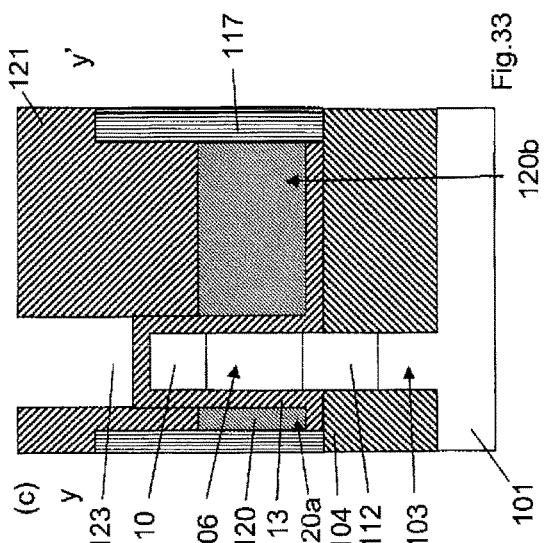
Fig. 33

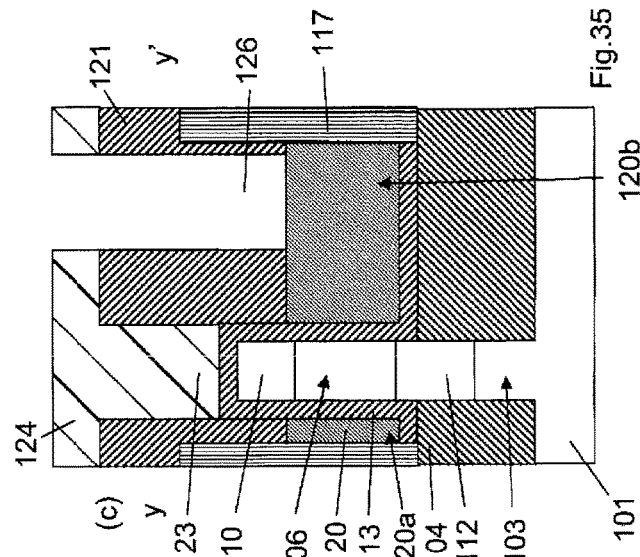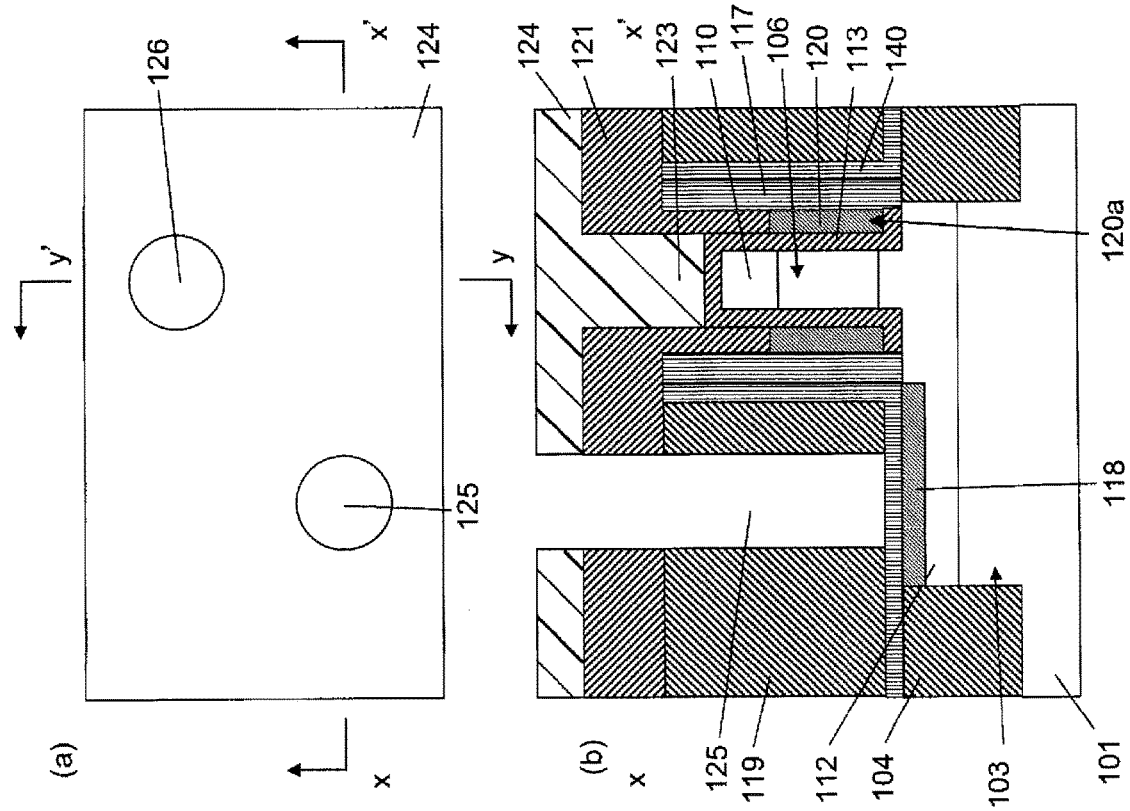
Fig. 35

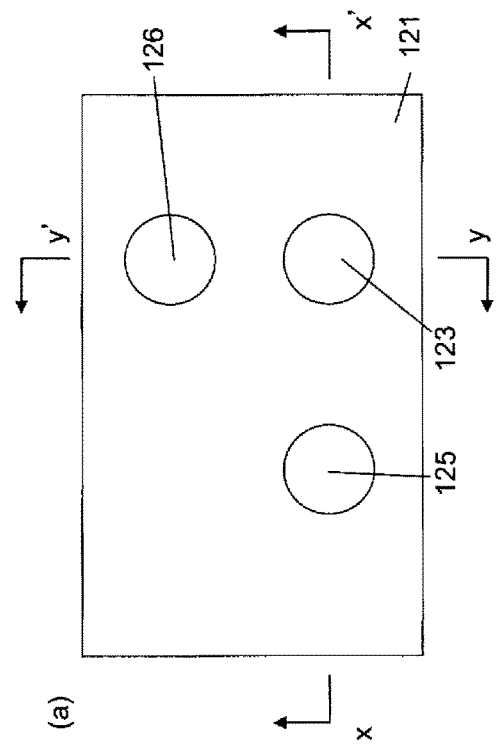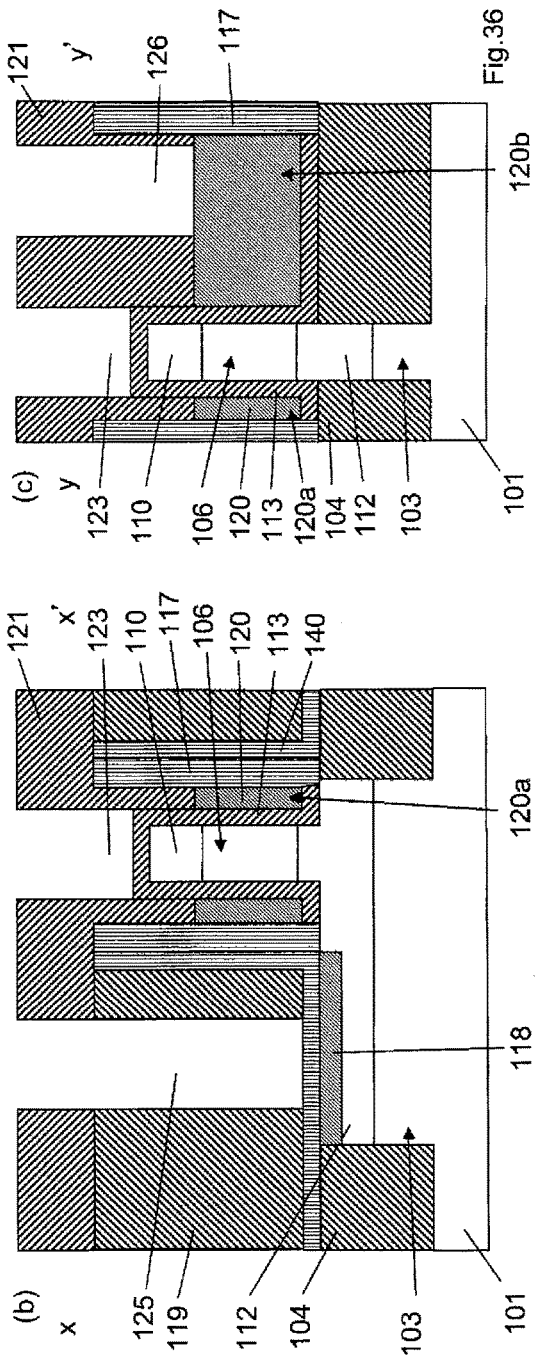
Fig. 36

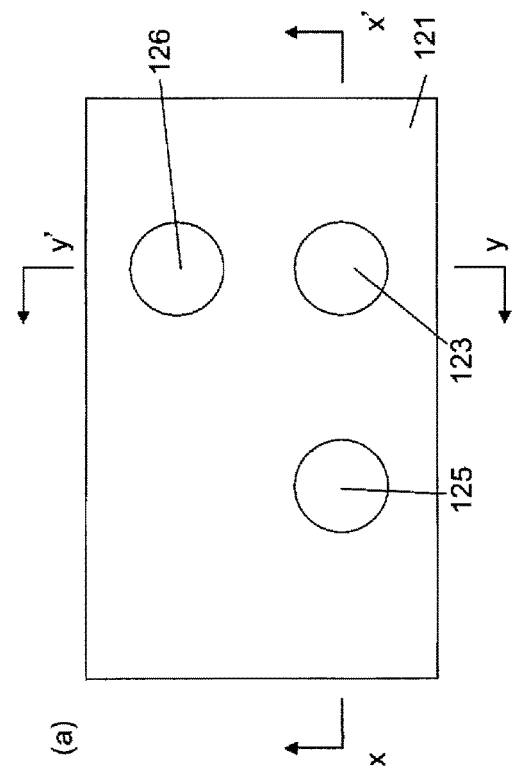
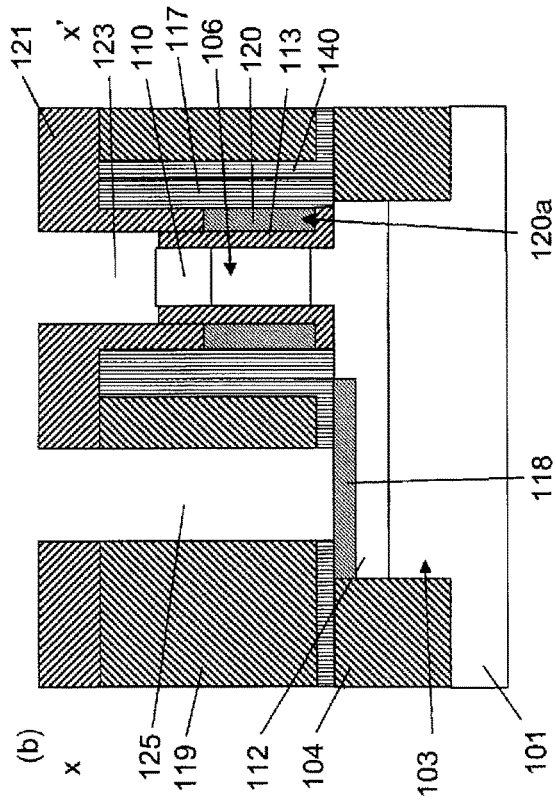
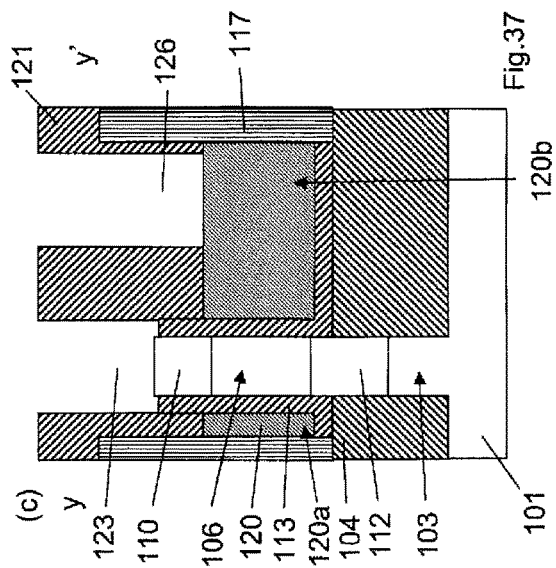
Fig.37

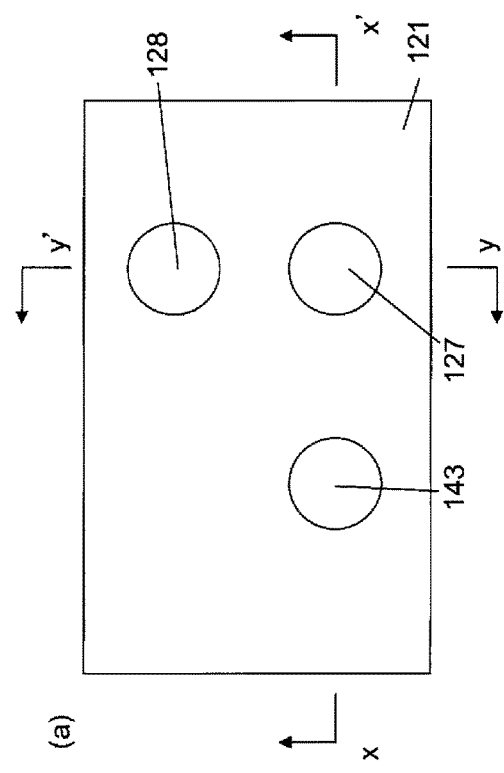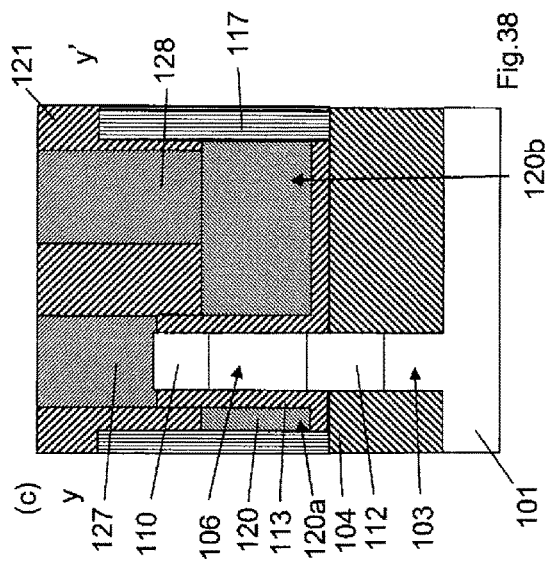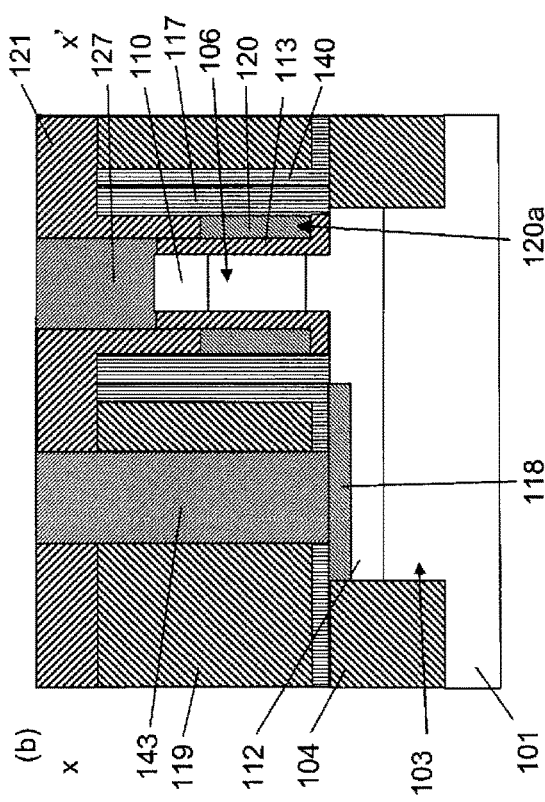
Fig.38

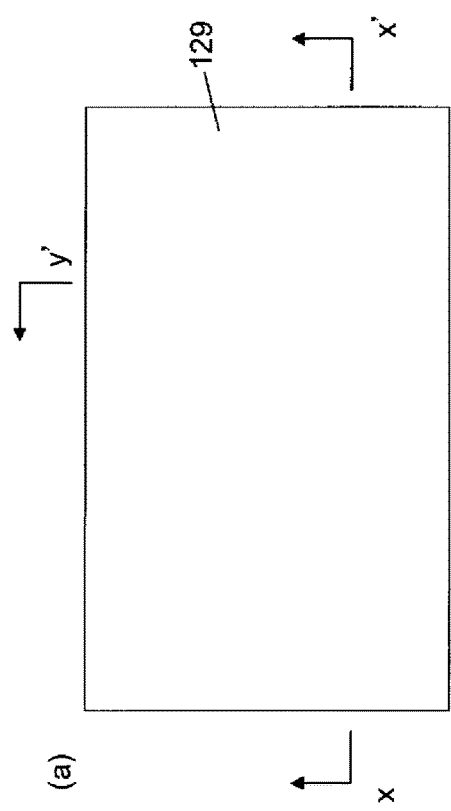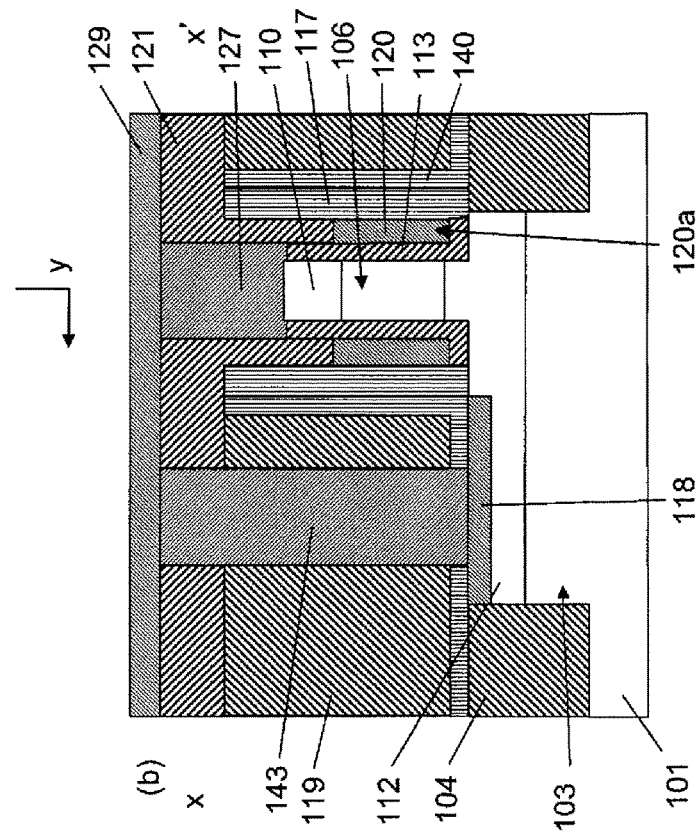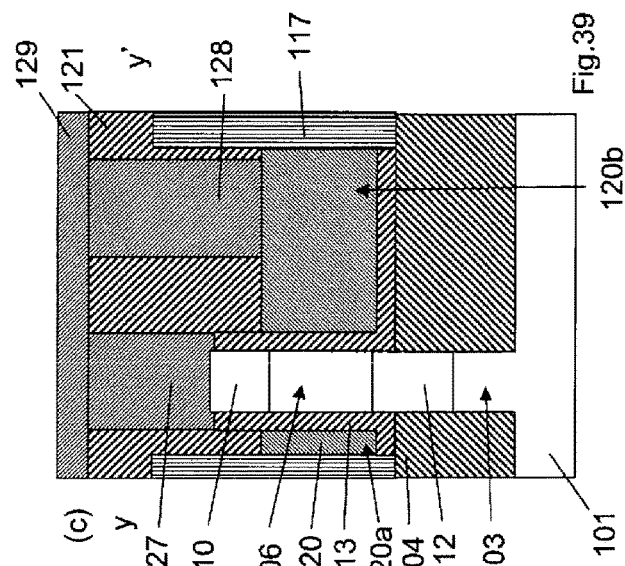
Fig. 39

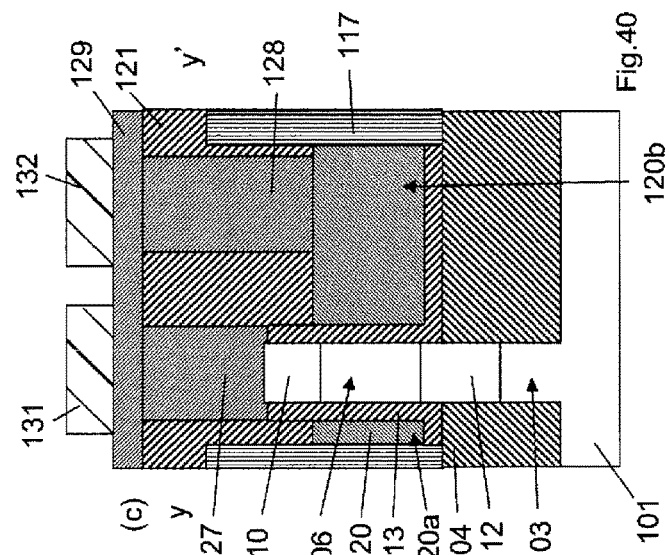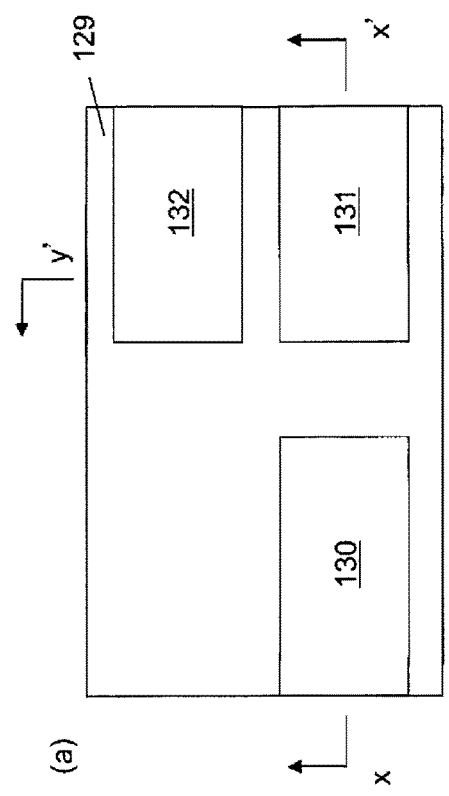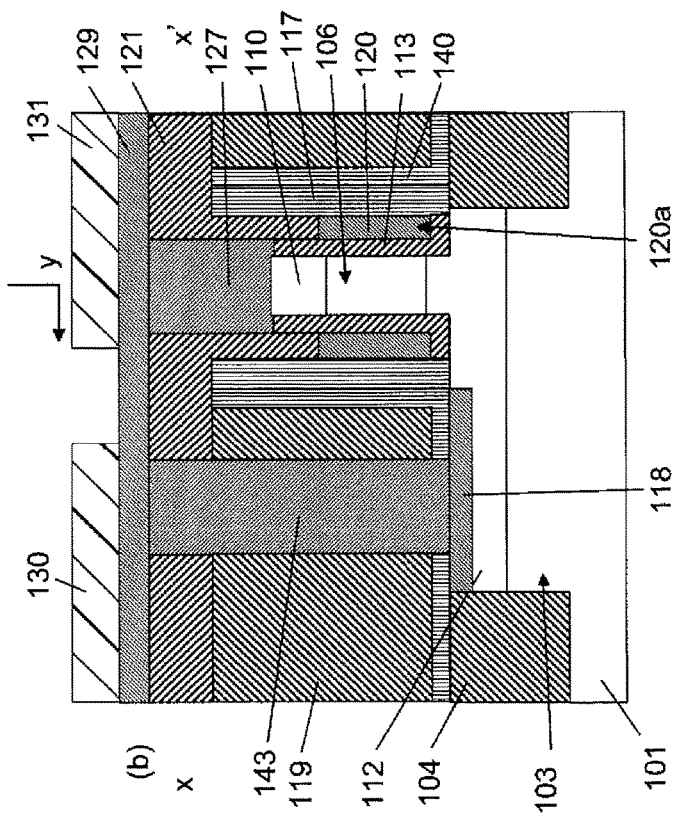
Fig. 40

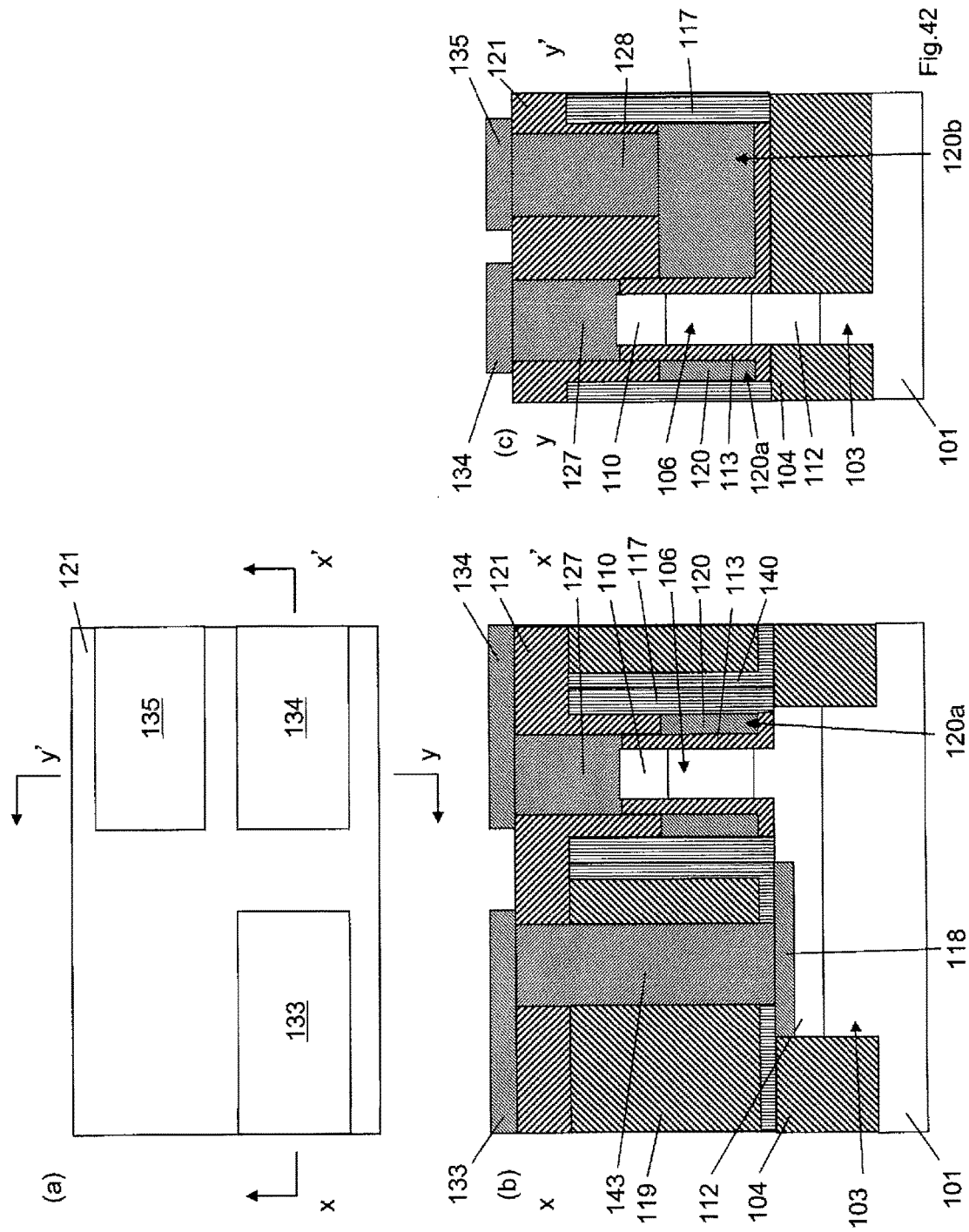

SEMICONDUCTOR DEVICE

RELATED APPLICATIONS

This application is a divisional application of U.S. patent application Ser. No. 13/666,445 filed on Nov. 1, 2012, which, pursuant to 35 U.S.C. §119(e), claims the benefit of U.S. Provisional Application No. 61/557,501 filed on Nov. 9, 2011. The entire disclosures of which are incorporated by reference herein.

BACKGROUND OF THE INVENTION

1. Field of the Invention

The present invention relates to a method for manufacturing a semiconductor device and to a semiconductor device.

2. Description of the Related Art

Semiconductor integrated circuits, particularly integrated circuits using MOS transistors, are increasing in integration. With increases in integration, MOS transistors used in the integrated circuits are increasingly made finer up to a nano region. Finer MOS transistors have the problem of difficulty in suppressing leak currents and difficulty in decreasing the areas occupied by circuits because of the demand for securing necessary amounts of currents. In order to resolve the problem, there have been proposed surrounding gate transistors (SGT) having a structure in which a source, a gate, and a drain are disposed in a direction vertical to a substrate, and the gate surrounds a pillar-shaped semiconductor layer (for example, Japanese Unexamined Patent Application Publication Nos. 2-71556, 2-188966, and 3-145761).

By using a metal for a gate electrode instead of using polysilicon, depletion can be suppressed, and the resistance of the gate electrode can be decreased. However, a manufacturing process after a metal gate is formed must be one in which metal contamination by the metal gate is always taken into consideration.

In addition, in order to satisfy both a metal gate process and a high-temperature process for usual MOS transistors, a metal gate last process is used for actual products, in which a metal gate is formed after a high-temperature process (IEDM 2007 K. Mistry, et. al., pp. 247-250). The gate is formed using polysilicon, and then an interlayer insulating film is deposited. Then, the polysilicon gate is exposed by chemical mechanical polishing and etched, followed by deposition of a metal. Therefore, in order to satisfy both the metal gate process and the high-temperature process, the metal gate last process must be used for SGT, in which a metal gate is formed after the high-temperature process. Since, in the SGT, the upper surface of the pillar-shaped silicon layer is higher than the gate, some consideration is required for using the metal gate last process.

In addition, usual MOS transistors use a first insulating film in order to decrease a parasitic capacitance between gate wiring and a substrate. For example, in FINFET (IEDM 2010 CC. Wu, et. al., 27.1.1-27.1.4.), a first insulating film is formed around a fin-shaped semiconductor layer and then etched back to expose the fin-shaped semiconductor layer, thereby decreasing the parasitic capacitance between the gate wiring and the substrate. Also, in SGT, the first insulating film must be used for decreasing the parasitic capacitance between the gate wiring and the substrate. The SGT includes the pillar-shaped semiconductor layer in addition to the fin-shaped semiconductor layer, and thus some consideration is required for forming the pillar-shaped semiconductor layer.

SUMMARY OF THE INVENTION

Accordingly, an object is to decrease a parasitic capacitance between a gate wiring and a substrate, provide a SGT manufacturing method using a gate last process, and provide a resulting SGT structure.

A method for manufacturing a semiconductor device of the present invention includes:

a first step of forming a fin-shaped silicon layer on a silicon substrate, forming a first insulating film around the fin-shaped silicon layer, and forming a pillar-shaped silicon layer on the fin-shaped silicon layer, the width of the pillar-shaped silicon layer being equal to the width of the fin-shaped silicon layer;

a second step of, after the first step, forming diffusion layers by implanting impurities in an upper portion of the pillar-shaped silicon layer, an upper portion of the fin-shaped silicon layer, and a lower portion of the pillar-shaped silicon layer;

a third step of, after the second step, forming a gate insulating film, a polysilicon gate electrode, and a polysilicon gate wiring so that the gate insulating film covers the periphery and the top of the pillar-shaped silicon layer, the polysilicon gate electrode covers the gate insulating film, and after the polysilicon gate electrode and the polysilicon gate wiring are formed, the upper surface of polysilicon is higher than the gate insulating film on the diffusion layer formed in the upper portion of the pillar-shaped silicon layer;

a fourth step of, after the third step, forming a silicide in an upper portion of the diffusion layer in the upper portion of the fin-shaped silicon layer;

a fifth step of, after the fourth step, depositing an interlayer insulating film, exposing the polysilicon gate electrode and the polysilicon gate wiring, etching the polysilicon gate electrode and the polysilicon gate wiring, and then depositing a metal to form a metal gate electrode and a metal gate wiring, the metal gate wiring being connected to the metal gate electrode and extending in a direction perpendicular to the fin-shaped silicon layer; and a sixth step of, after the fifth step, forming a contact so as to make direct contact between the contact and the diffusion layer in the upper portion of the pillar-shaped silicon layer.

The manufacturing method is also characterized in that a first resist is formed for forming the fin-shaped silicon layer on the silicon substrate; the silicon substrate is etched to form the fin-shaped silicon layer and the first resist is removed; the first insulating film is deposited around the fin-shaped silicon layer and then etched back to expose an upper portion of the fin-shaped silicon layer; a second resist is formed to be perpendicular to the fin-shaped silicon layer; the fin-shaped silicon layer is etched; and then the second resist is removed to form the pillar-shaped silicon layer so that a portion where the fin-shaped silicon layer and the second resist intersect at right angles becomes the pillar-shaped silicon layer.

The manufacturing method is further characterized in that in a structure including the fin-shaped silicon layer formed on the silicon substrate, the first insulating film formed around the fin-shaped silicon layer, and the pillar-shaped silicon layer formed on the fin-shaped silicon layer, a second oxide film is deposited, a first nitride film is formed on the second oxide film, the first nitride film is etched to be left as a side wall, the diffusion layers are formed by impurity implantation in an upper portion of the pillar-shaped silicon layer and an upper portion of the fin-shaped silicon layer, and the first nitride film and the second oxide film are removed, followed by heat treatment.

The manufacturing method is further characterized in that in a structure including the fin-shaped silicon layer formed on the silicon substrate, the first insulating film formed around the fin-shaped silicon layer, the pillar-shaped silicon layer formed on the fin-shaped silicon layer, the diffusion layer formed in the upper portion of the fin-shaped silicon layer and in the lower portion of the pillar-shaped silicon layer, and the diffusion layer formed in the upper portion of the pillar-shaped silicon layer, the gate insulating film is formed, polysilicon is deposited and then planarized so that after planarization, the upper surface of the polysilicon is higher than the gate insulating film on the diffusion layer formed in the upper portion of the pillar-shaped silicon layer, a second nitride film is deposited, a third resist is formed for forming the polysilicon gate electrode and the polysilicon gate wiring, the second nitride film is etched, the polysilicon is etched to form the polysilicon gate electrode and the polysilicon gate wiring, the gate insulating film is etched, and the third resist is removed.

The manufacturing method is further characterized in that a third nitride film is deposited and then etched to be left as a side wall, and a metal is deposited to form a silicide in an upper portion of the diffusion layer in the upper portion of the fin-shaped silicon layer.

The manufacturing method is further characterized in that a fourth nitride film is deposited, the interlayer insulating film is deposited and then planarized, the polysilicon gate electrode and the polysilicon gate wiring are exposed, the polysilicon gate electrode and the polysilicon gate wiring are removed, a metal is filled in a portion from which the polysilicon gate electrode and the polysilicon gate wiring have been removed, and the metal is etched to expose the gate insulating film on the diffusion layer in the upper portion of the pillar-shaped silicon layer, thereby forming the metal gate electrode and the metal gate wiring.

A semiconductor device of the present invention includes: a fin-shaped silicon layer formed on a silicon substrate; a first insulating film formed around the fin-shaped silicon layer; a pillar-shaped silicon layer formed on the fin-shaped silicon layer, the width of the pillar-shaped silicon layer being equal to the width of the fin-shaped silicon layer; a diffusion layer formed in an upper portion of the fin-shaped silicon layer and a lower portion of the pillar-shaped silicon layer; a diffusion layer formed in an upper portion of the pillar-shaped silicon layer; a silicide formed in an upper portion of the diffusion layer in the upper portion of the fin-shaped silicon layer; a gate insulating film formed around the pillar-shaped silicon layer; a metal gate electrode formed around the gate insulating film: a metal gate wiring connected to the metal gate electrode and extending in a direction perpendicular to the fin-shaped silicon layer; and a contact formed on the diffusion layer formed in the upper portion of the pillar-shaped silicon layer so as to make direct contact between the contact and the diffusion layer formed in the upper portion of the pillar-shaped silicon layer.

According to the present invention, it is possible to decrease a parasitic capacitance between a gate wiring and a substrate, provide a SGT manufacturing method using a gate last process, and provide a resulting SGT structure.

The fin-shaped silicon layer, the first insulating film, and the pillar-shaped silicon layer are formed based on a conventional FINFET manufacturing method and thus can be easily formed.

In addition, a silicide is generally formed in an upper portion of the pillar-shaped silicon layer, but the silicide must be formed after a polysilicon gate is formed because the deposition temperature of polysilicon is higher than the silicide formation temperature.

Therefore, when the silicide is formed in an upper portion of a silicon column, a hole is formed on a polysilicon gate electrode after the polysilicon gate is formed, the silicide is formed after a side wall composed of an insulating film is formed on the side wall of the hole, and then the hole is filled with an insulating film, thereby causing the problem of increasing the number of manufacturing steps. Therefore, the diffusion layers are formed before the polysilicon gate electrode and the polysilicon gate wiring are formed, the pillar-shaped silicon layer is covered with the polysilicon gate electrode, and the silicide is formed only in an upper portion of the fin-shaped silicon layer. Therefore, a usual metal gate last manufacturing method can be used, in which a gate is formed using polysilicon, the interlayer insulating film is deposited, the polysilicon gate is exposed by chemical mechanical polishing and then etched, and then a metal is deposited, thereby facilitating the formation of metal gate SGT.

BRIEF DESCRIPTION OF THE DRAWINGS

FIG. 2(a) is a plan view of a method for manufacturing a semiconductor device according to the present invention, FIG. 2(b) is a sectional view taken along line X-X' in FIG. 2(a), and FIG. 2(c) is a sectional view taken along line Y-Y' in FIG. 2(a).

FIG. 5(a) is a plan view of a method for manufacturing a semiconductor device according to the present invention, FIG. 5(b) is a sectional view taken along line X-X' in FIG. 5(a), and FIG. 5(c) is a sectional view taken along line Y-Y' in FIG. 5(a).

FIG. 9(a) is a plan view of a method for manufacturing a semiconductor device according to the present invention, FIG. 9(b) is a sectional view taken along line X-X' in FIG. 9(a), and FIG. 9(c) is a sectional view taken along line Y-Y' in FIG. 9(a).

FIG. 22(a) is a plan view of a method for manufacturing a semiconductor device according to the present invention, FIG. 22(b) is a sectional view taken along line X-X' in FIG. 22(a), and FIG. 22(c) is a sectional view taken along line Y-Y' in FIG. 22(a).

FIG. 24(a) is a plan view of a method for manufacturing a semiconductor device according to the present invention, FIG. 24(b) is a sectional view taken along line X-X' in FIG. 24(a), and FIG. 24(c) is a sectional view taken along line Y-Y' in FIG. 24(a).

FIG. 26(a) is a plan view of a method for manufacturing a semiconductor device according to the present invention, FIG. 26(b) is a sectional view taken along line X-X' in FIG. 26(a), and FIG. 26(c) is a sectional view taken along line Y-Y' in FIG. 26(a).

FIG. 27(a) is a plan view of a method for manufacturing a semiconductor device according to the present invention, FIG. 27(b) is a sectional view taken along line X-X' in FIG. 27(a), and FIG. 27(c) is a sectional view taken along line Y-Y' in FIG. 27(a).

FIG. 28(a) is a plan view of a method for manufacturing a semiconductor device according to the present invention, FIG. 28(b) is a sectional view taken along line X-X' in FIG. 28(a), and FIG. 28(c) is a sectional view taken along line Y-Y' in FIG. 28(a).

FIG. 29(a) is a plan view of a method for manufacturing a semiconductor device according to the present invention, FIG. 29(b) is a sectional view taken along line X-X' in FIG. 29(a), and FIG. 29(c) is a sectional view taken along line Y-Y' in FIG. 29(a).

FIG. 30(a) is a plan view of a method for manufacturing a semiconductor device according to the present invention, FIG. 30(b) is a sectional view taken along line X-X' in FIG. 30(a), and FIG. 30(c) is a sectional view taken along line Y-Y' in FIG. 30(a).

FIG. 33(a) is a plan view of a method for manufacturing a semiconductor device according to the present invention, FIG. 33(b) is a sectional view taken along line X-X' in FIG. 33(a), and FIG. 33(c) is a sectional view taken along line Y-Y' in FIG. 33(a).

FIG. 35(a) is a plan view of a method for manufacturing a semiconductor device according to the present invention, FIG. 35(b) is a sectional view taken along line X-X' in FIG. 35(a), and FIG. 35(c) is a sectional view taken along line Y-Y' in FIG. 35(a).

FIG. 36(a) is a plan view of a method for manufacturing a semiconductor device according to the present invention, FIG. 36(b) is a sectional view taken along line X-X' in FIG. 36(a), and FIG. 36(c) is a sectional view taken along line Y-Y' in FIG. 36(a).

FIG. 37(a) is a plan view of a method for manufacturing a semiconductor device according to the present invention, FIG. 37(b) is a sectional view taken along line X-X' in FIG. 37(a), and FIG. 37(c) is a sectional view taken along line Y-Y' in FIG. 37(a).

FIG. 38(a) is a plan view of a method for manufacturing a semiconductor device according to the present invention, FIG. 38(b) is a sectional view taken along line X-X' in FIG. 38(a), and FIG. 38(c) is a sectional view taken along line Y-Y' in FIG. 38(a).

FIG. 39(a) is a plan view of a method for manufacturing a semiconductor device according to the present invention, FIG. 39(b) is a sectional view taken along line X-X' in FIG. 39(a), and FIG. 39(c) is a sectional view taken along line Y-Y' in FIG. 39(a).

FIG. 40(a) is a plan view of a method for manufacturing a semiconductor device according to the present invention, FIG. 40(b) is a sectional view taken along line X-X' in FIG. 40(a), and FIG. 40(c) is a sectional view taken along line Y-Y' in FIG. 40(a).

FIG. 42(a) is a plan view of a method for manufacturing a semiconductor device according to the present invention, FIG. 42(b) is a sectional view taken along line X-X' in FIG. 42(a), and FIG. 42(c) is a sectional view taken along line Y-Y' in FIG. 42(a).

DETAILED DESCRIPTION OF THE PREFERRED EMBODIMENTS

A manufacturing process for forming a SGT structure according to an embodiment of the present invention is described below with reference to FIGS. 2 to 42.

First, a manufacturing method for forming a fin-shaped silicon layer on a silicon substrate, forming a first insulating film around the fin-shaped silicon layer, and forming a pillar-shaped silicon layer on the fin-shaped silicon layer is described. As shown in FIG. 2, a first resist 102 is formed for forming a fin-shaped silicon layer on a silicon substrate 101.

Figure 3:
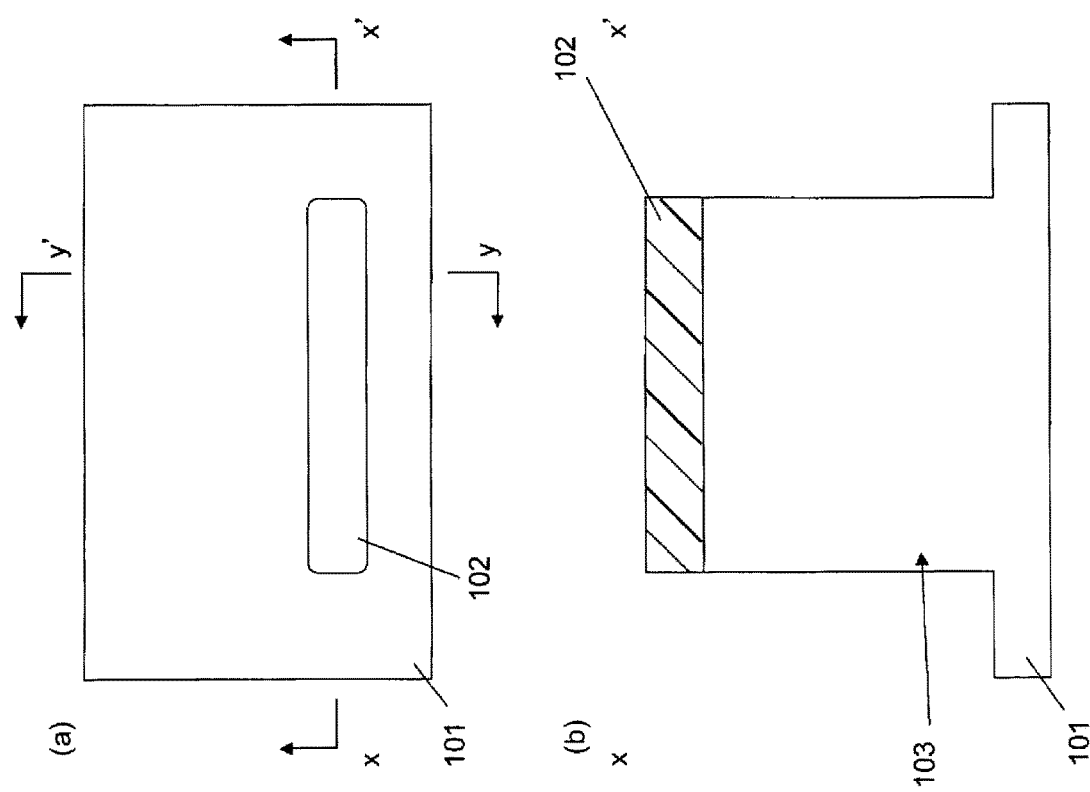
FIG. 3(a) is a plan view of a method for manufacturing a semiconductor device according to the present invention.
FIG. 3(b) is a sectional view taken along line X-X' in FIG. 3(a)
FIG. 3(c) is a sectional view taken along line Y-Y' in FIG. 3(a).

As shown in FIG. 3, the silicon substrate 101 is etched to form a fin-shaped silicon layer 103. Although, in this case, the fin-shaped silicon layer is formed using the resist as a mask, a hard mask such as an oxide film or a nitride film may be used.

Figure 4:
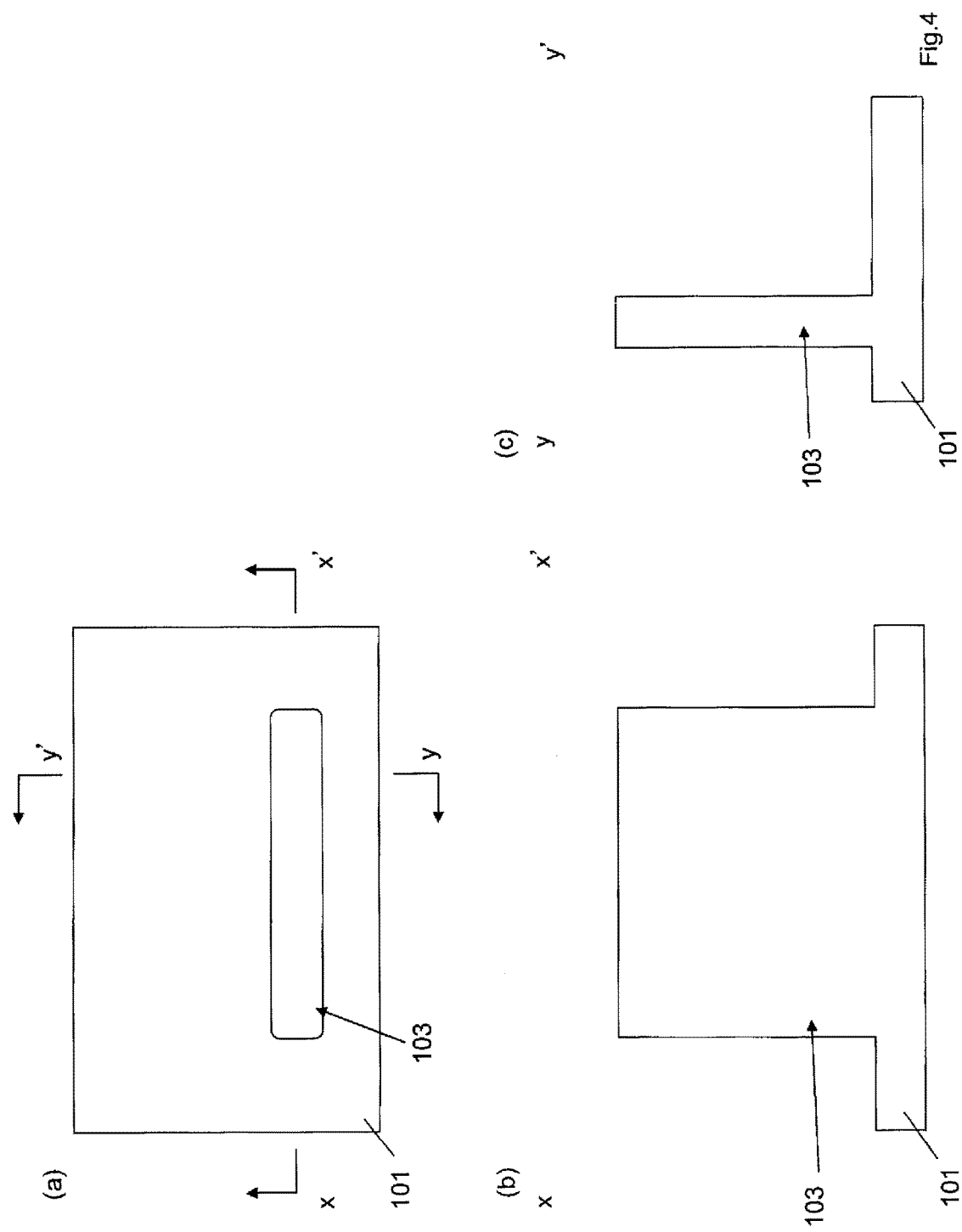
FIG. 4(a) is a plan view of a method for manufacturing a semiconductor device according to the present invention.
FIG. 4(b) is a sectional view taken along line X-X' in FIG. 4(a)
FIG. 4(c) is a sectional view taken along line Y-Y' in FIG. 4(a).

As shown in FIG. 4, the first resist 102 is removed.

As shown in FIG. 5, a first insulating film 104 is deposited around the fin-shaped silicon layer 103. As the first insulating film, an oxide film formed by high-density plasma, or an oxide film formed by low-pressure chemical vapor deposition may be used.

Figure 6:
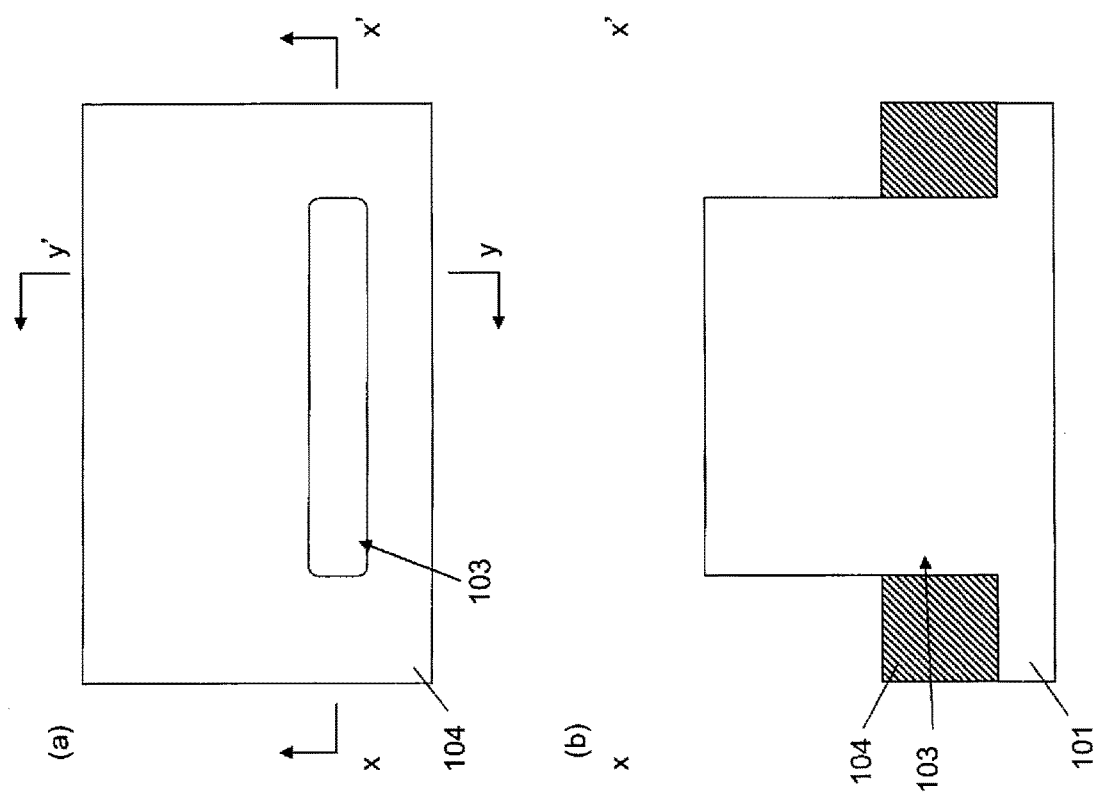
FIG. 6(a) is a plan view of a method for manufacturing a semiconductor device according to the present invention.
FIG. 6(b) is a sectional view taken along line X-X' in FIG. 6(a)
FIG. 6(c) is a sectional view taken along line Y-Y' in FIG. 6(a).

As shown in FIG. 6, the first insulating film 104 is etched back to expose an upper portion of the fin-shaped silicon layer 103. The steps up to this step are the same as in the method for forming a fin-shaped silicon layer of Japanese Unexamined Patent Application Publication No. 2-188966.

Figure 7:
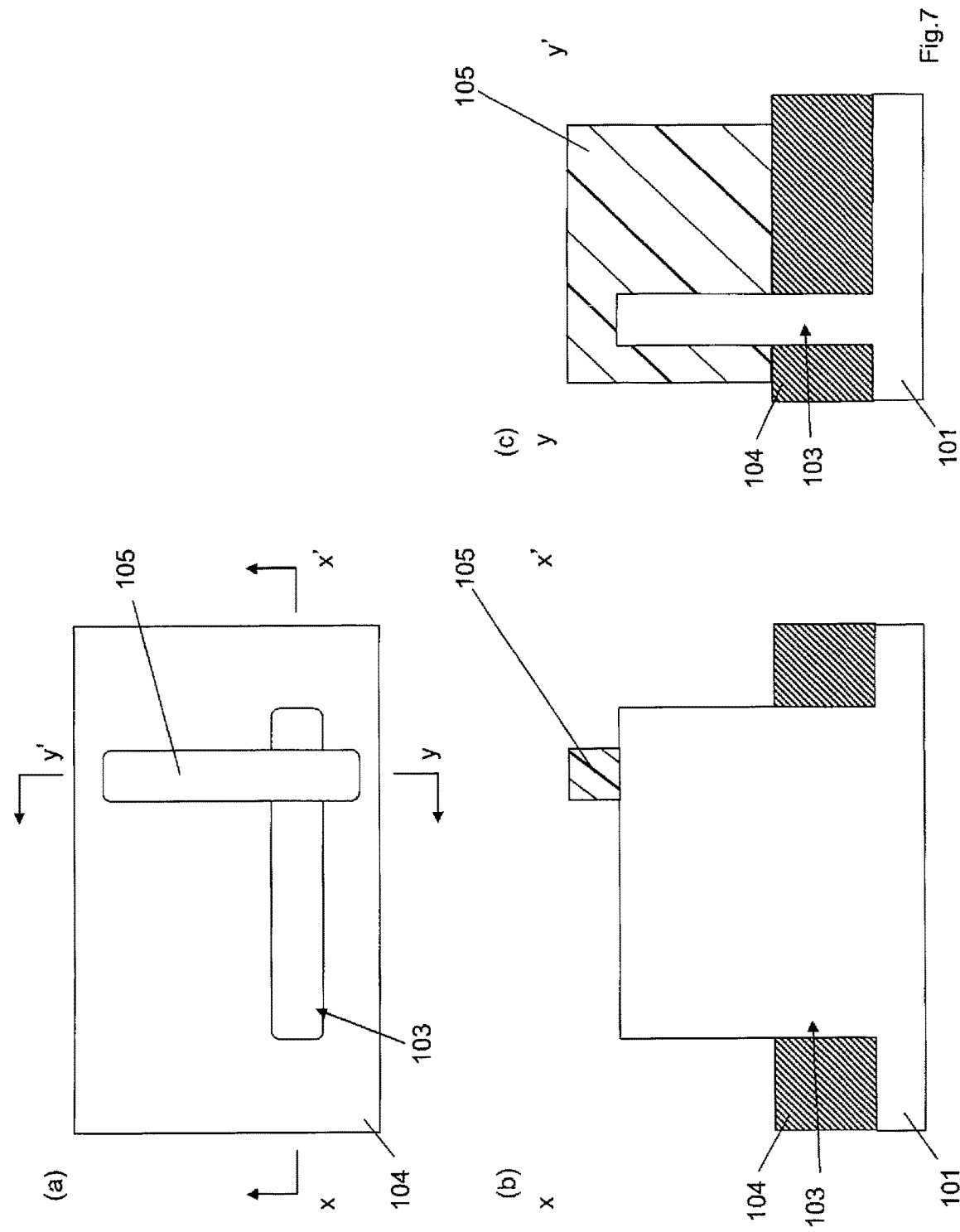
FIG. 7(a) is a plan view of a method for manufacturing a semiconductor device according to the present invention.
FIG. 7(b) is a sectional view taken along line X-X' in FIG. 7(a)
FIG. 7(c) is a sectional view taken along line Y-Y' in FIG. 7(a).

As shown in FIG. 7, a second resist 105 is formed so as to be perpendicular to the fin-shaped silicon layer 103. A portion where the fin-shaped silicon layer 103 and the second resist 105 intersect at right angles becomes a pillar-shaped silicon layer. Since a linear resist can be used, the resist is unlikely to fall after patterning, thereby realizing a stable process.

Figure 8:
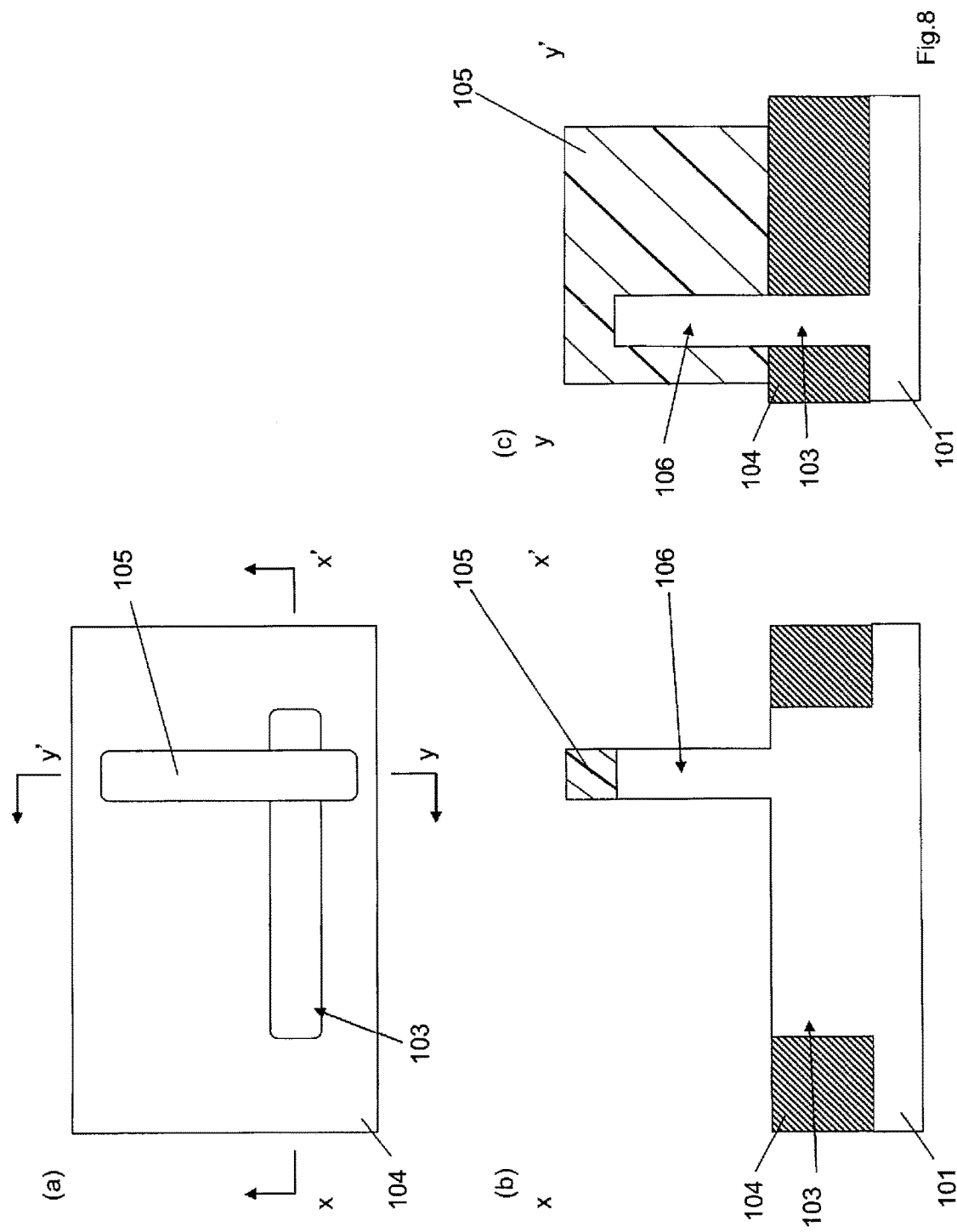
FIG. 8(a) is a plan view of a method for manufacturing a semiconductor device according to the present invention.
FIG. 8(b) is a sectional view taken along line X-X' in FIG. 8(a)
FIG. 8(c) is a sectional view taken along line Y-Y' in FIG. 8(a).

As shown in FIG. 8, the fin-shaped silicon layer 103 is etched. A portion where the fin-shaped silicon layer 103 and the second resist 105 intersect at right angles becomes the pillar-shaped silicon layer 106. Therefore, the width of the pillar-shaped silicon layer 106 is equal to the width of the fin-shaped silicon layer. As a result, a structure is formed, in which the pillar-shaped silicon layer 106 is formed in an upper portion of the fin-shaped silicon layer 103, and the first insulating film 104 is formed around the fin-shaped silicon layer 103.

As shown in FIG. 9, the second resist 105 is removed.

Figure 10:
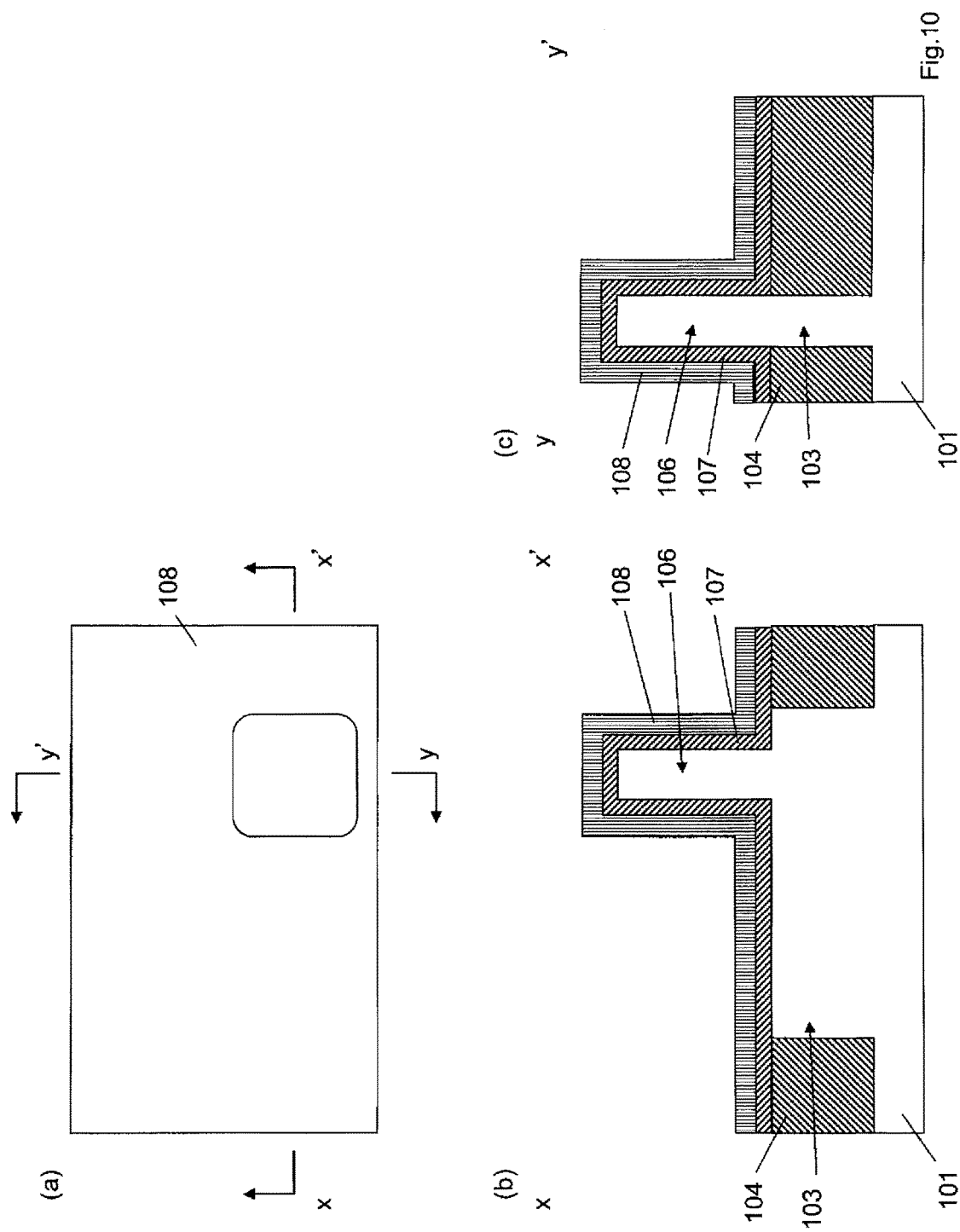
FIG. 10(a) is a plan view of a method for manufacturing a semiconductor device according to the present invention.
FIG. 10(b) is a sectional view taken along line X-X' in FIG. 10(a)
FIG. 10(c) is a sectional view taken along line Y-Y' in FIG. 10(a).

Next, a description is given of a manufacturing method for forming diffusion layers by implanting impurities in an upper portion of the pillar-shaped silicon layer, an upper portion of the fin-shaped silicon layer, and a lower portion of the pillar-shaped silicon layer in order to use a gate-last process. As shown in FIG. 10, a second oxide film 107 is deposited, and a first nitride film 108 is formed. Since an upper portion of the pillar-shaped silicon layer is subsequently covered with a gate insulating film and a polysilicon gate electrode, a diffusion layer is formed in an upper portion of the pillar-shaped silicon layer before covering of the pillar-shaped silicon layer.

Figure 11:
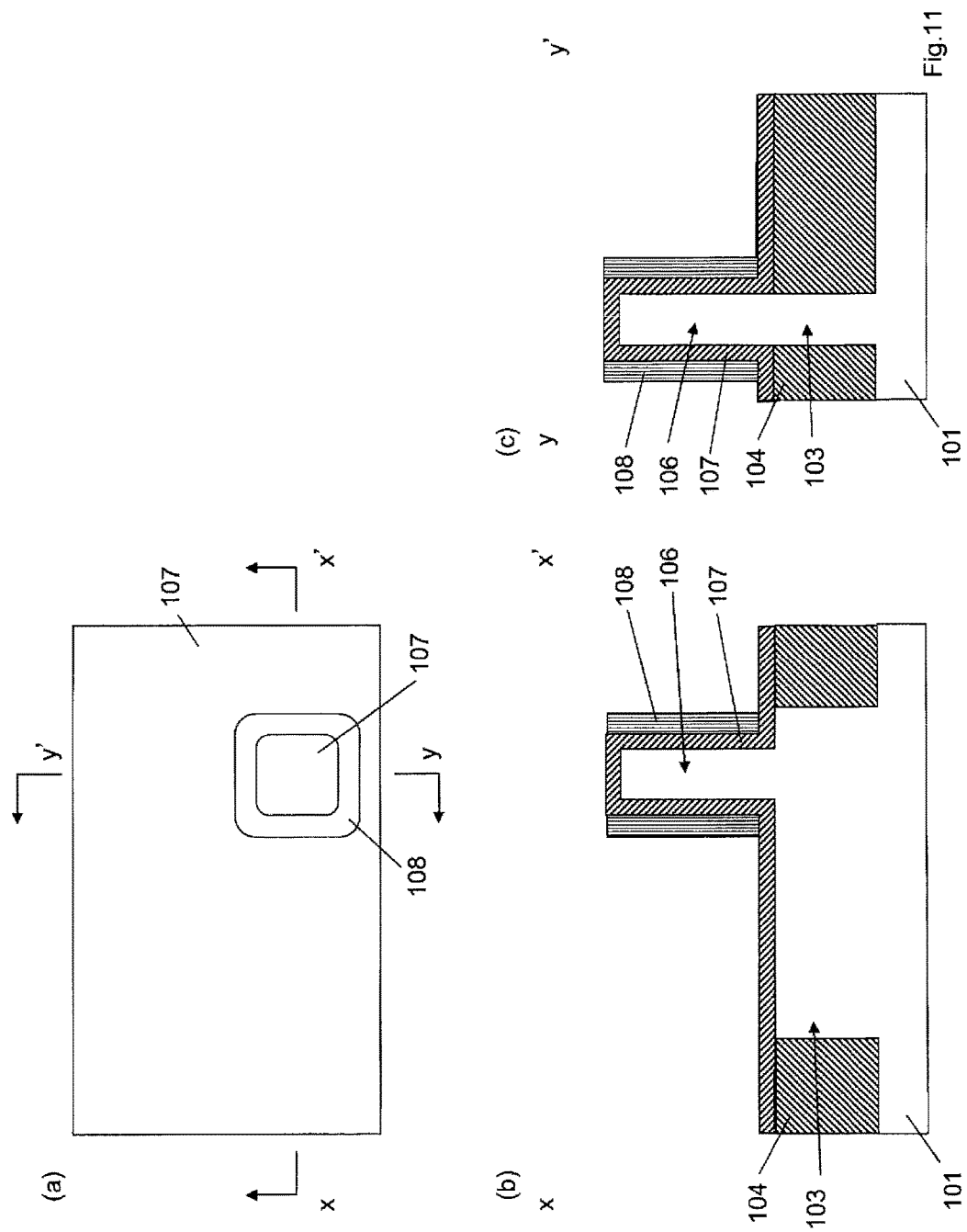
FIG. 11(a) is a plan view of a method for manufacturing a semiconductor device according to the present invention.
FIG. 11(b) is a sectional view taken along line X-X' in FIG. 11(a)
FIG. 11(c) is a sectional view taken along line Y-Y' in FIG. 11(a).

As shown in FIG. 11, the first nitride film 108 is etched to be left as a wide wall.

Figure 12:
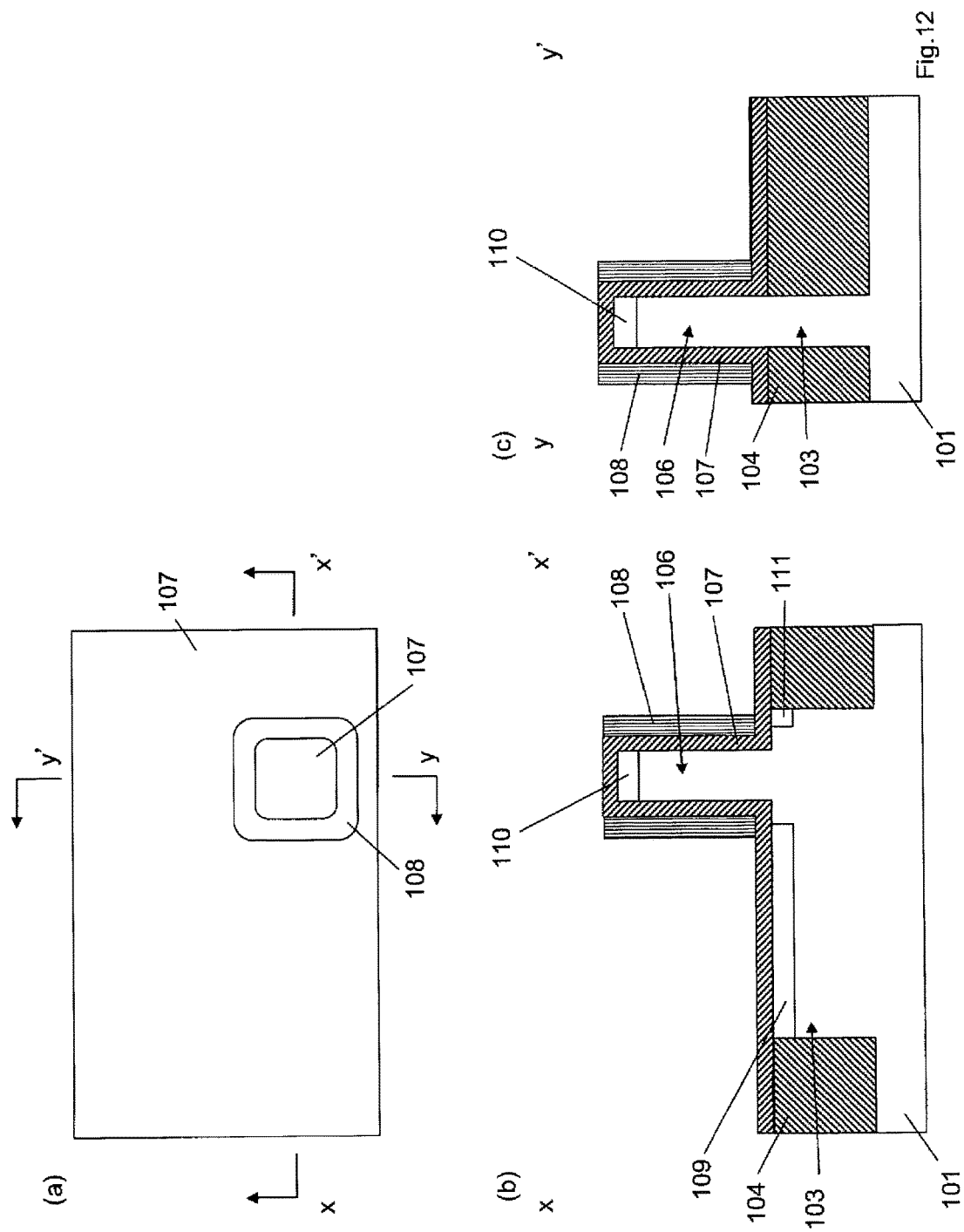
FIG. 12(a) is a plan view of a method for manufacturing a semiconductor device according to the present invention.
FIG. 12(b) is a sectional view taken along line X-X' in FIG. 12(a)
FIG. 12(c) is a sectional view taken along line Y-Y' in FIG. 12(a).

As shown in FIG. 12, impurities such as arsenic, phosphorus, or boron are implanted to form a diffusion layer 110 in an upper portion of the pillar-shaped silicon layer, and diffusion layers 109 and 111 in an upper portion of the fin-shaped silicon layer 103.

Figure 13:
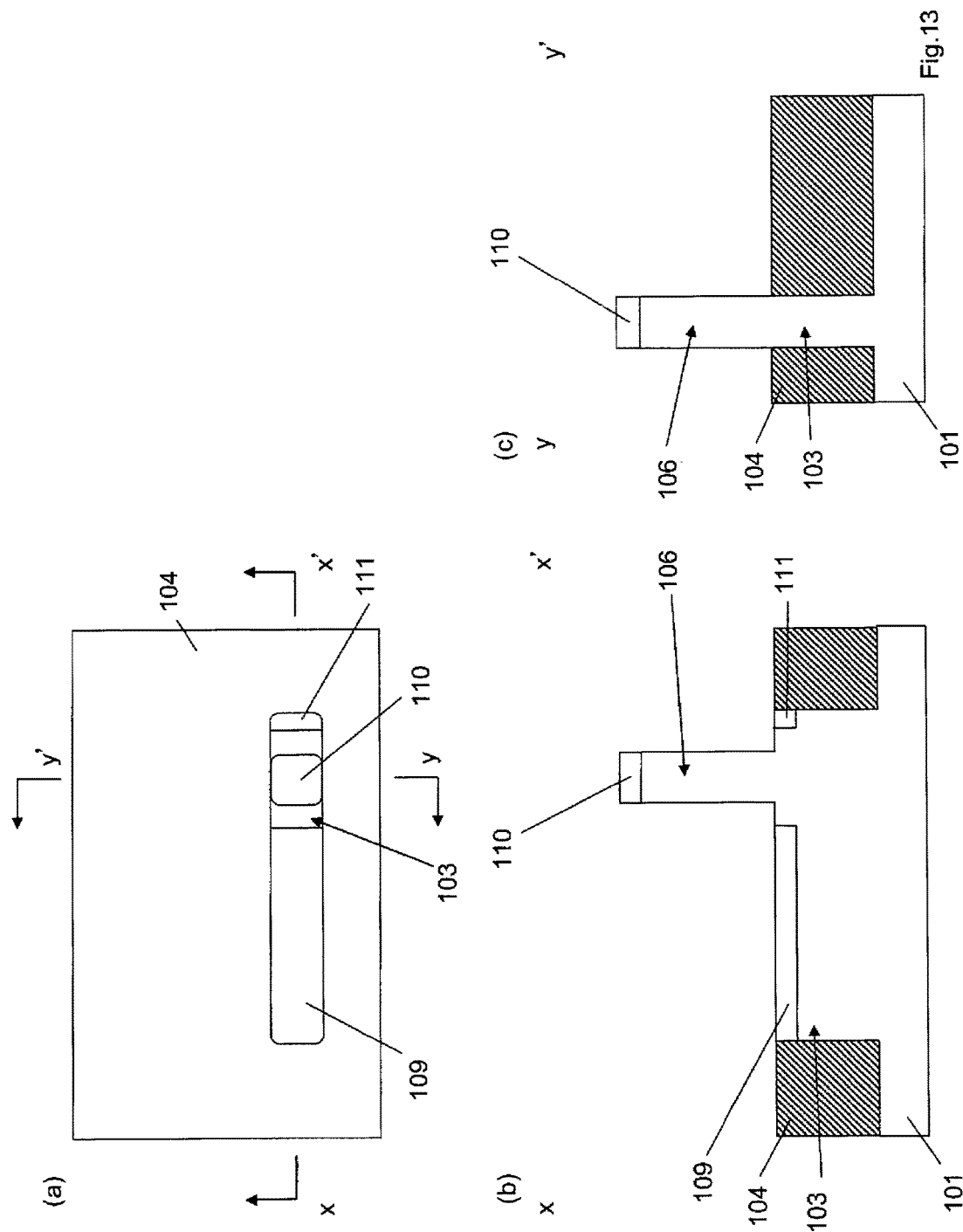
FIG. 13(a) is a plan view of a method for manufacturing a semiconductor device according to the present invention.
FIG. 13(b) is a sectional view taken along line X-X' in FIG. 13(a)
FIG. 13(c) is a sectional view taken along line Y-Y' in FIG. 13(a).

As shown in FIG. 13, the first nitride film 108 and the second oxide film 107 are removed.

Figure 14:
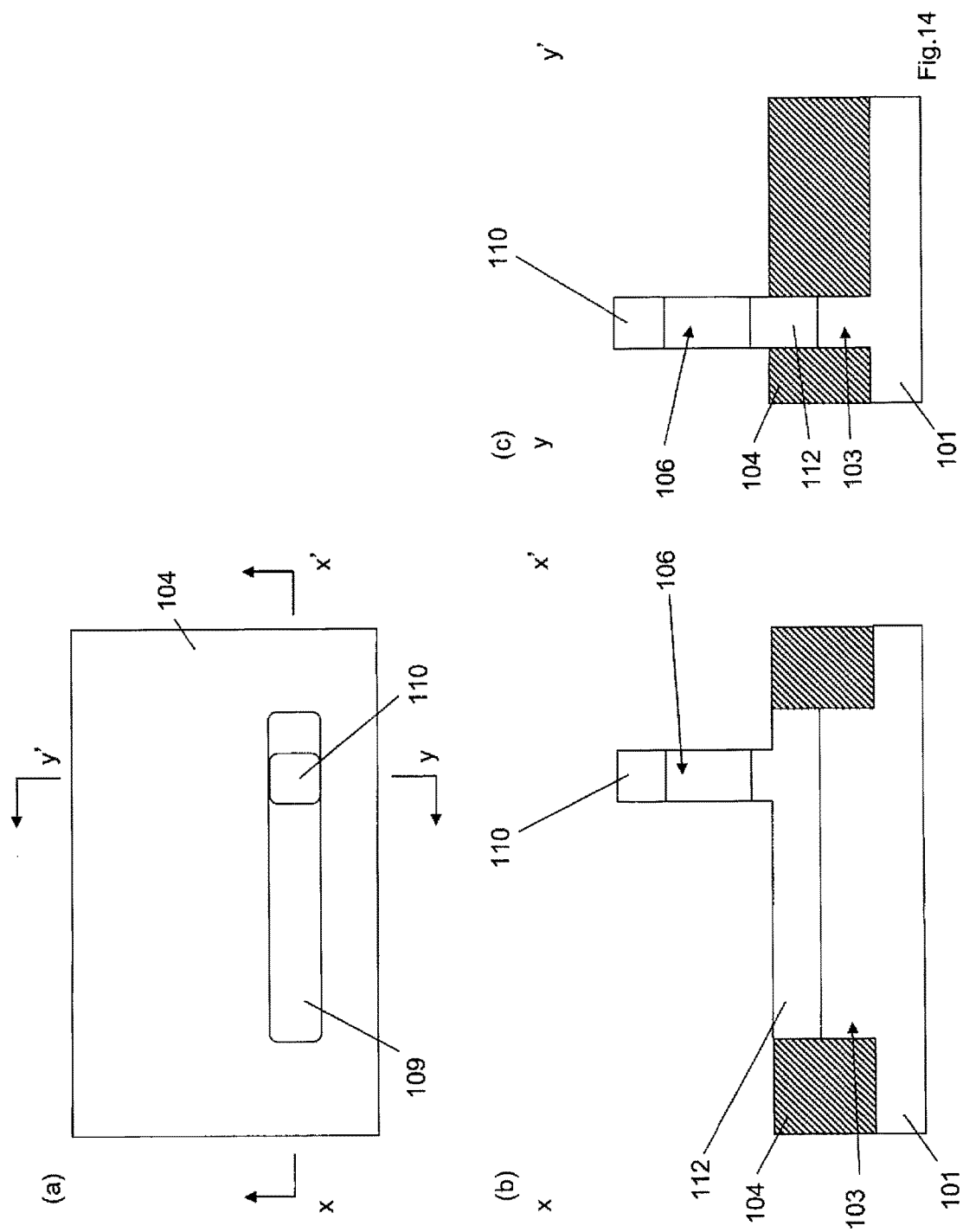
FIG. 14(a) is a plan view of a method for manufacturing a semiconductor device according to the present invention.
FIG. 14(b) is a sectional view taken along line X-X' in FIG. 14(a)
FIG. 14(c) is a sectional view taken along line Y-Y' in FIG. 14(a).

As shown in FIG. 14, heat treatment is performed. The diffusion layers 109 and 111 in an upper portion of the fin-shaped silicon layer 103 are brought into contact with each other to form a diffusion layer 112. As described above, in order to use the gate-last process, the diffusion layers 110 and 112 are formed by impurity implantation in an upper portion of the pillar-shaped silicon layer and in an upper portion of the fin-shaped silicon layer and a lower portion of the pillar-shaped silicon layer.

Next, a description is given of a manufacturing method for forming a polysilicon gate electrode and a polysilicon gate wiring using polysilicon in order to use the gate-last process. In order to use the gate-last process, an interlayer insulating film is deposited, and then the polysilicon gate electrode and the polysilicon gate wiring are exposed by chemical mechanical polishing. Therefore, it is necessary to prevent an upper portion of the pillar-shaped silicon layer from being exposed by chemical mechanical polishing.

Figure 15:
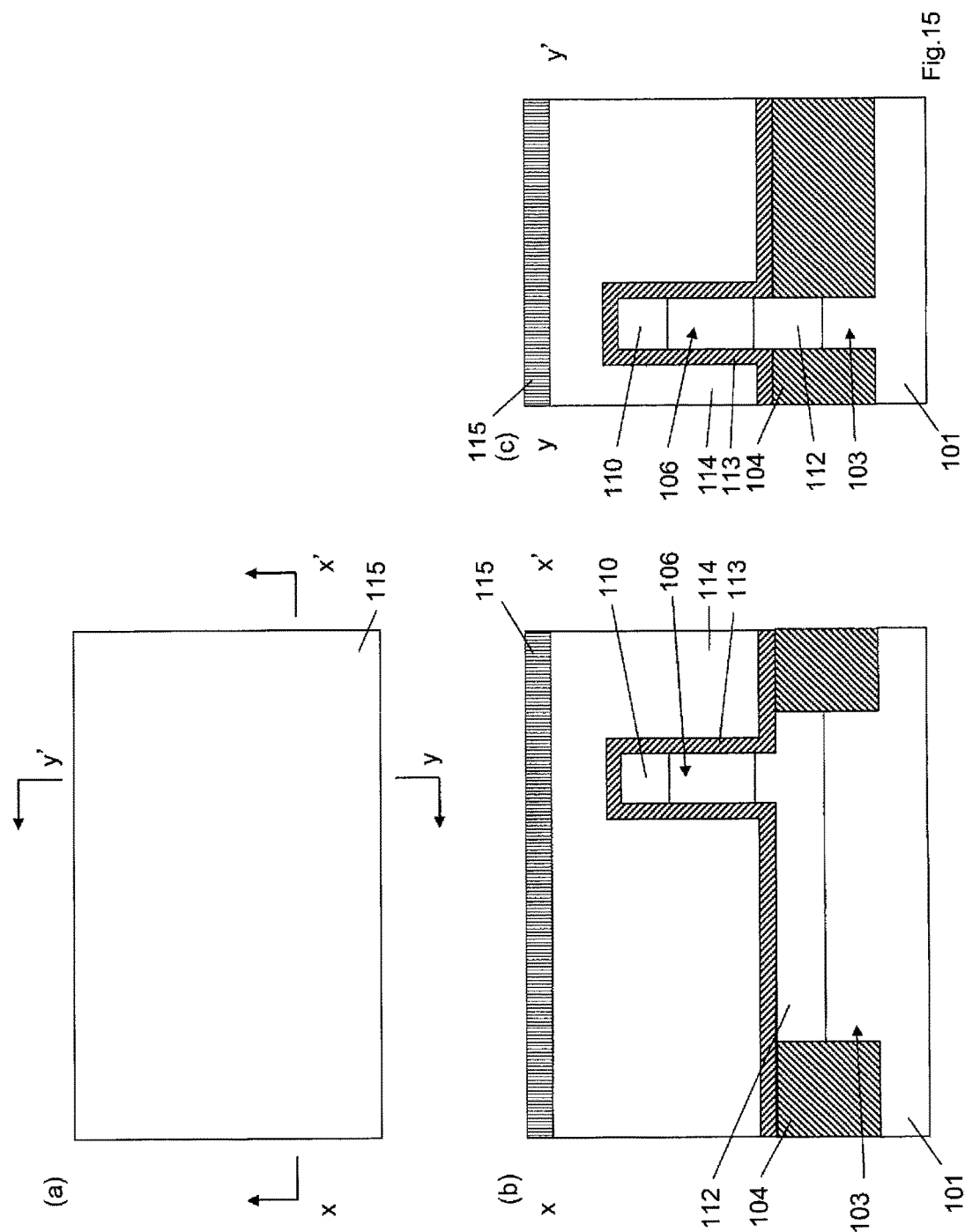
FIG. 15(a) is a plan view of a method for manufacturing a semiconductor device according to the present invention.
FIG. 15(b) is a sectional view taken along line X-X' in FIG. 15(a)
FIG. 15(c) is a sectional view taken along line Y-Y' in FIG. 15(a).

As shown in FIG. 15, a gate insulating film 113 is formed, and polysilicon 114 is deposited and then planarized. After planarization, the upper surface of the polysilicon is higher than the gate insulating film 113 disposed on the diffusion layer 110 in an upper portion of the pillar-shaped silicon layer 106. As a result, when in order to use the gate-last process, the polysilicon gate electrode and the polysilicon gate wiring are exposed by chemical mechanical polishing after the interlayer insulating film is deposited, the upper portion of the pillar-shaped silicon layer is not exposed by chemical mechanical polishing.

In addition, a second nitride film 115 is deposited. The second nitride film is one which inhibits the formation of silicide in upper portions of the polysilicon gate electrode and the polysilicon gate wiring when the silicide is formed in an upper portion of the fin-shaped silicon layer.

Figure 16:
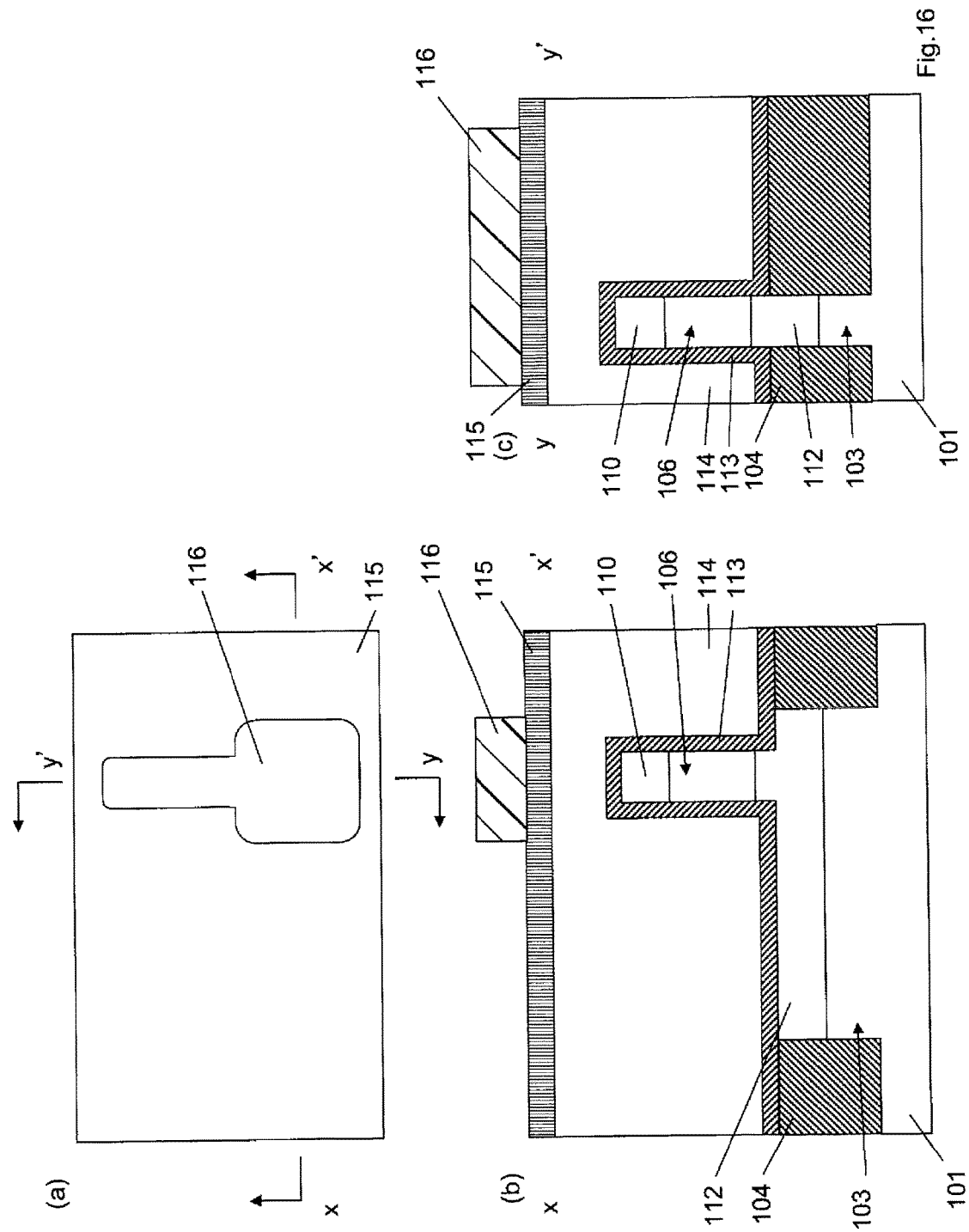
FIG. 16(a) is a plan view of a method for manufacturing a semiconductor device according to the present invention.
FIG. 16(b) is a sectional view taken along line X-X' in FIG. 16(a)
FIG. 16(c) is a sectional view taken along line Y-Y' in FIG. 16(a).

As shown in FIG. 16, a third resist 116 is formed for forming the polysilicon gate electrode and the polysilicon gate wiring. A portion corresponding to gate wiring is preferably perpendicular to the fin-shaped silicon layer 103. This is because a parasitic capacitance between the gate wiring and the substrate is decreased.

Figure 17:
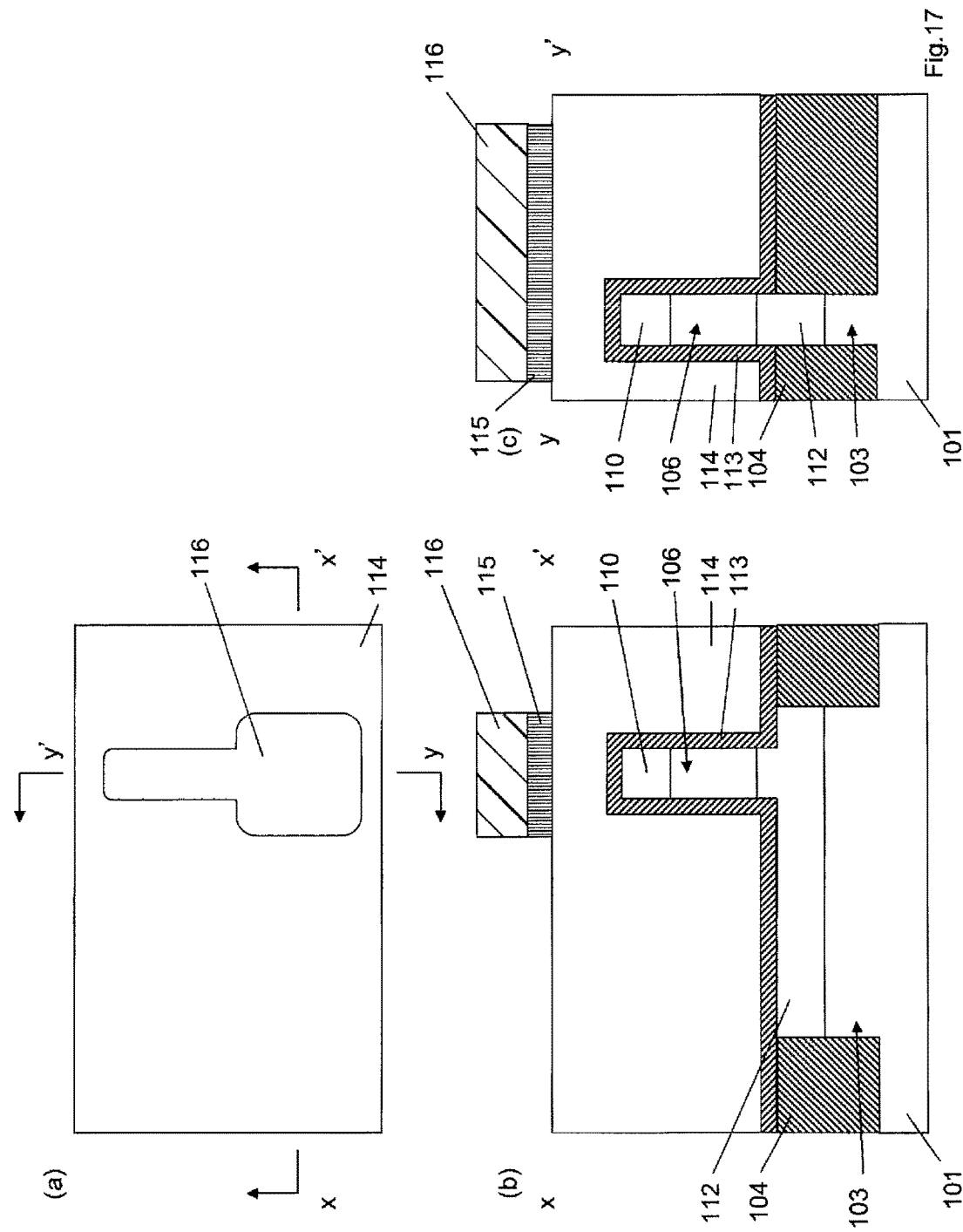
FIG. 17(a) is a plan view of a method for manufacturing a semiconductor device according to the present invention.
FIG. 17(b) is a sectional view taken along line X-X' in FIG. 17(a)
FIG. 17(c) is a sectional view taken along line Y-Y' in FIG. 17(a).

As shown in FIG. 17, the second nitride film 115 is etched.

Figure 18:
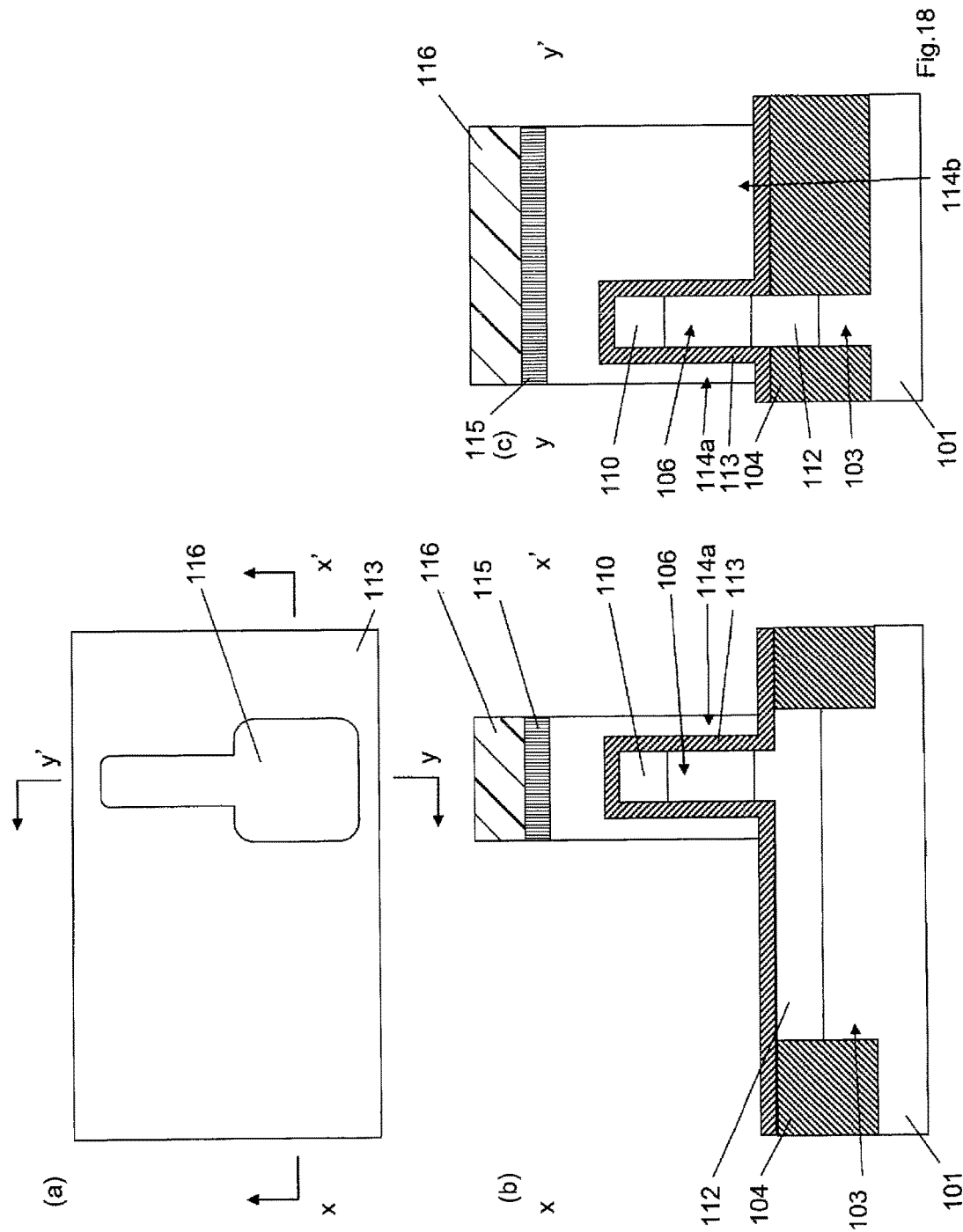
FIG. 18(a) is a plan view of a method for manufacturing a semiconductor device according to the present invention.
FIG. 18(b) is a sectional view taken along line X-X' in FIG. 18(a)
FIG. 18(c) is a sectional view taken along line Y-Y' in FIG. 18(a).

As shown in FIG. 18, the polysilicon 114 is etched to form a polysilicon gate electrode 114a and a polysilicon gate wiring 114b.

Figure 19:
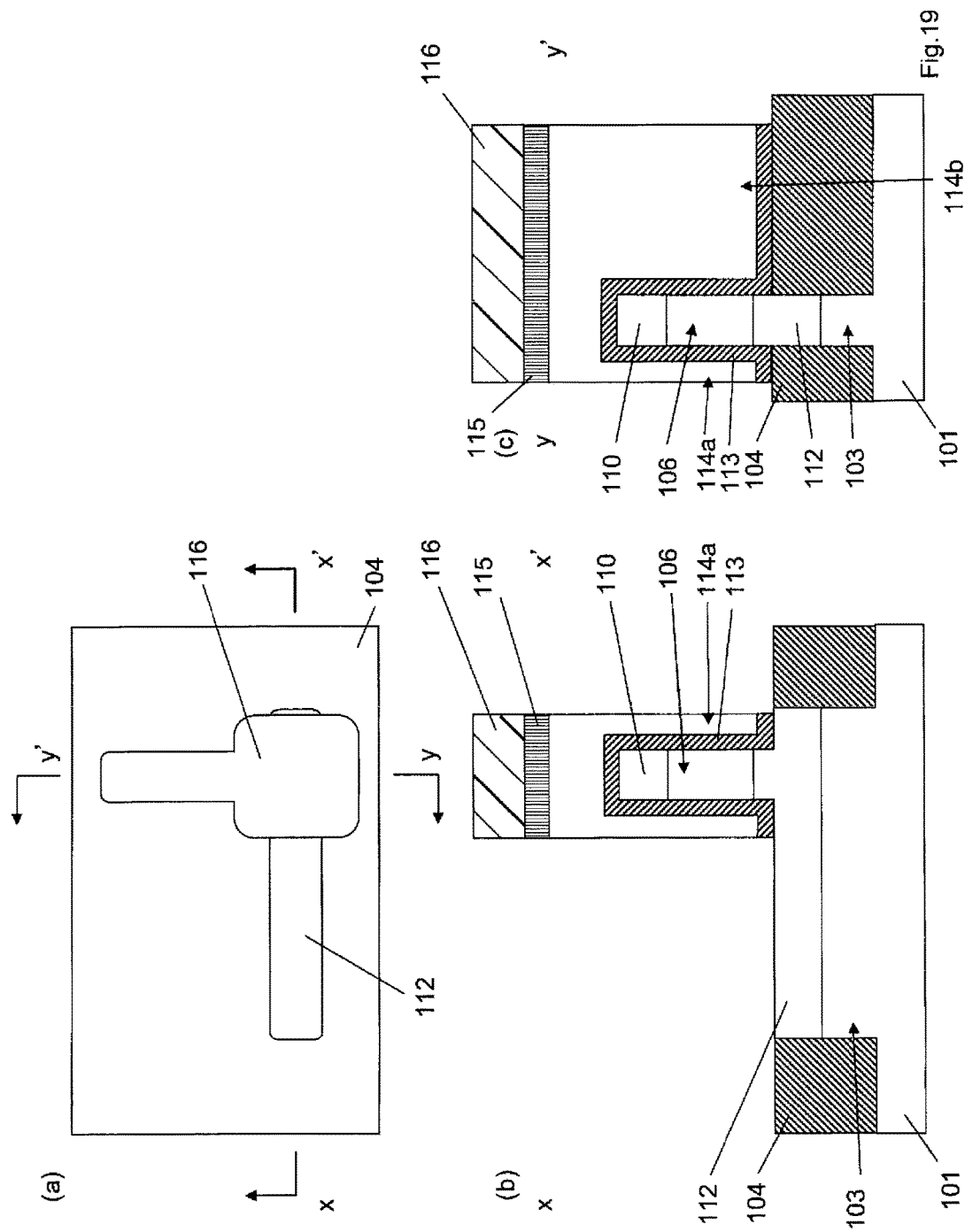
FIG. 19(a) is a plan view of a method for manufacturing a semiconductor device according to the present invention.
FIG. 19(b) is a sectional view taken along line X-X' in FIG. 19(a)
FIG. 19(c) is a sectional view taken along line Y-Y' in FIG. 19(a).

As shown in FIG. 19, the gate insulating film 113 is etched.

Figure 20:
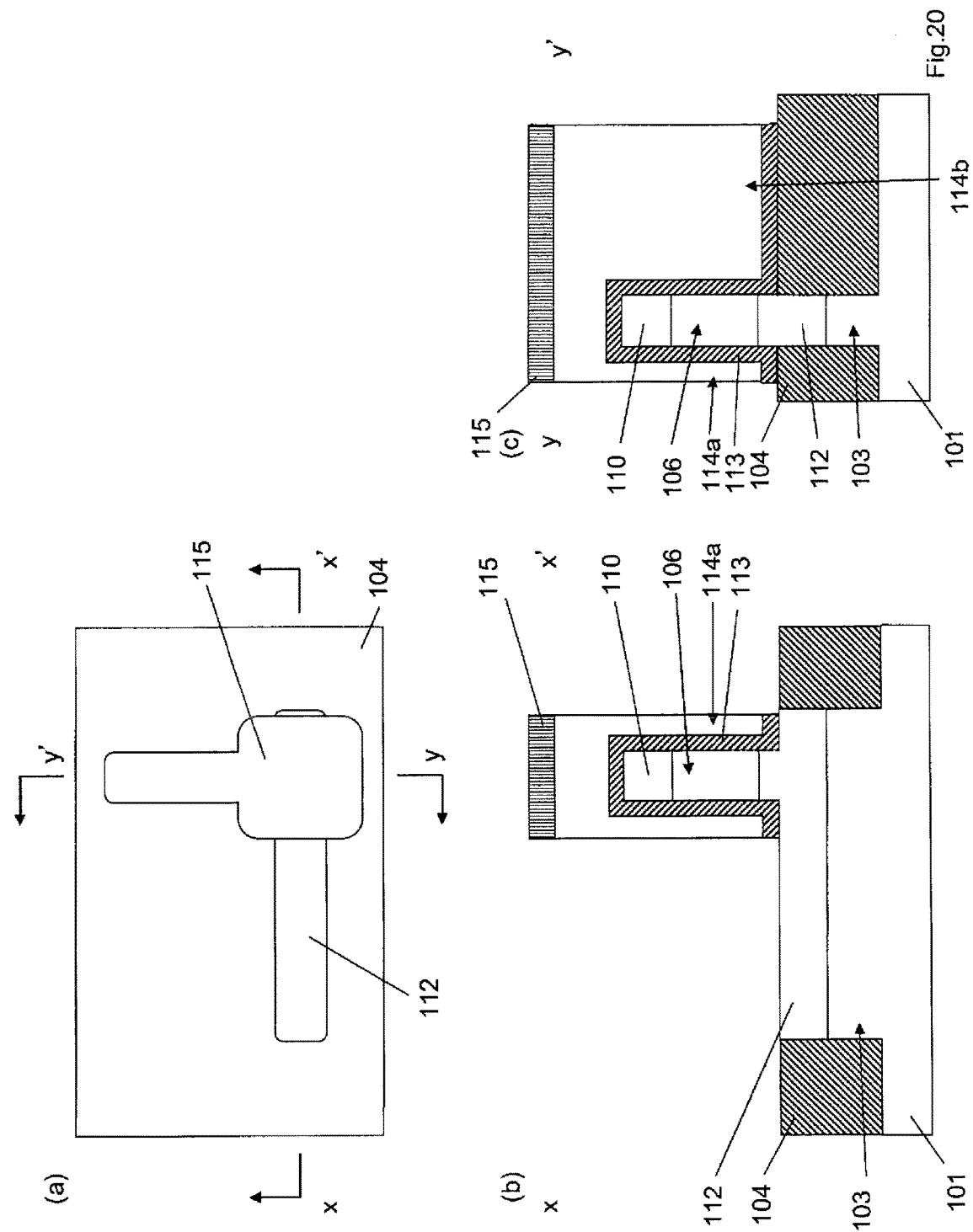
FIG. 20(a) is a plan view of a method for manufacturing a semiconductor device according to the present invention.
FIG. 20(b) is a sectional view taken along line X-X' in FIG. 20(a)
FIG. 20(c) is a sectional view taken along line Y-Y' in FIG. 20(a).

As shown in FIG. 20, the third resist 116 is removed.

The manufacturing method for forming the polysilicon gate electrode and the polysilicon gate wiring using polysilicon in order to use the gate-last process is described above. After the polysilicon gate electrode 114a and the polysilicon gate wiring 114b are formed, the upper surface of polysilicon is higher than the gate insulating film 113 on the diffusion layer 110 in an upper portion of the pillar-shaped silicon layer 106.

Next, a manufacturing method for forming a silicide in an upper portion of the fin-shaped silicon layer is described. The silicide is not formed in upper portions of the polysilicon gate electrode 114a and the polysilicon gate wiring 114b and in the diffusion layer 110 in an upper portion of the pillar-shaped silicon layer 106. When the silicide is formed in the diffusion layer 110 in an upper portion of the pillar-shaped silicon layer 106, the manufacturing process is enlarged.

Figure 21:
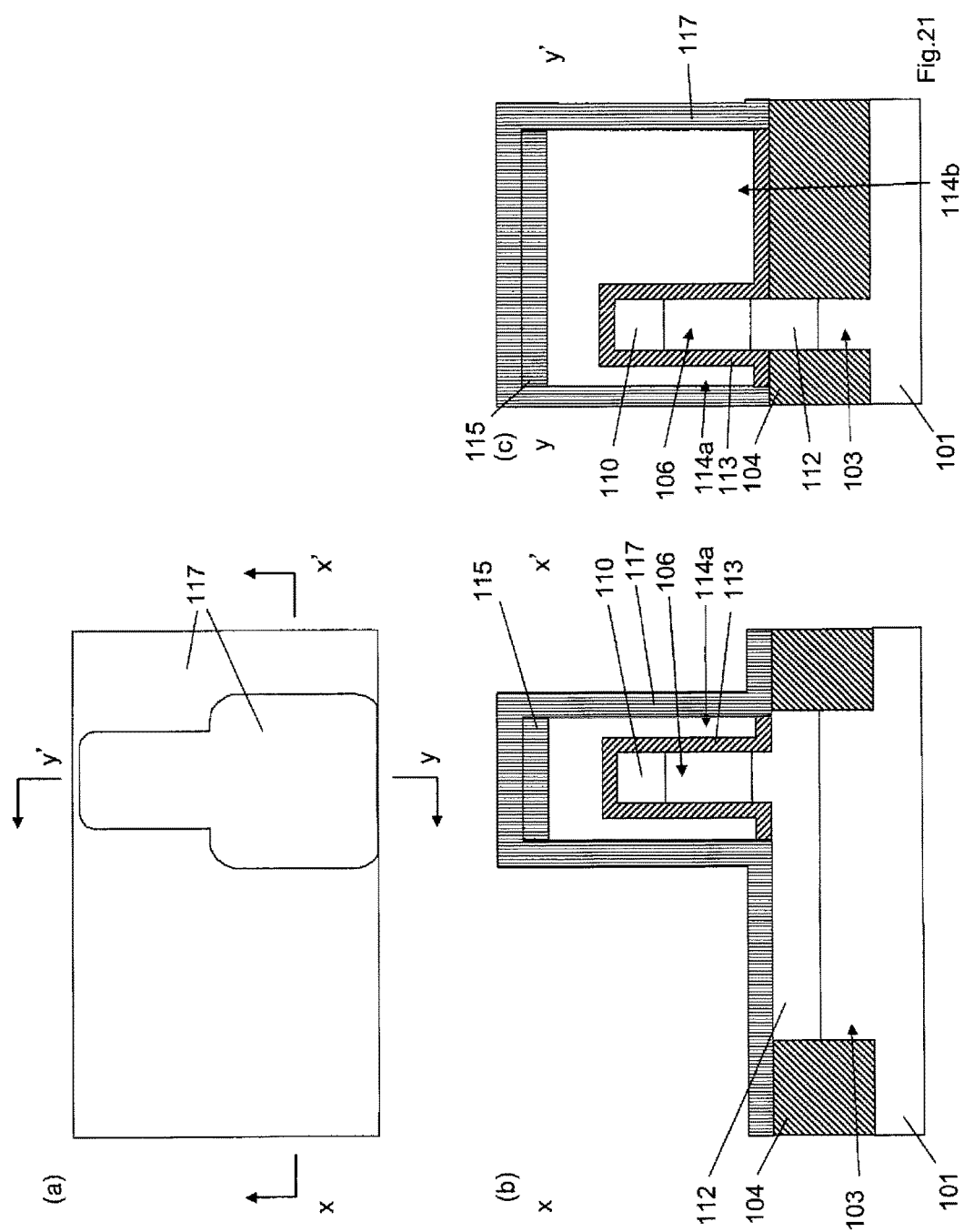
FIG. 21(a) is a plan view of a method for manufacturing a semiconductor device according to the present invention.
FIG. 21(b) is a sectional view taken along line X-X' in FIG. 21(a)
FIG. 21(c) is a sectional view taken along line Y-Y' in FIG. 21(a).

As shown in FIG. 21, a third nitride film 117 is deposited.

As shown in FIG. 22, the third nitride film 117 is etched to be left as a side wall.

Figure 23:
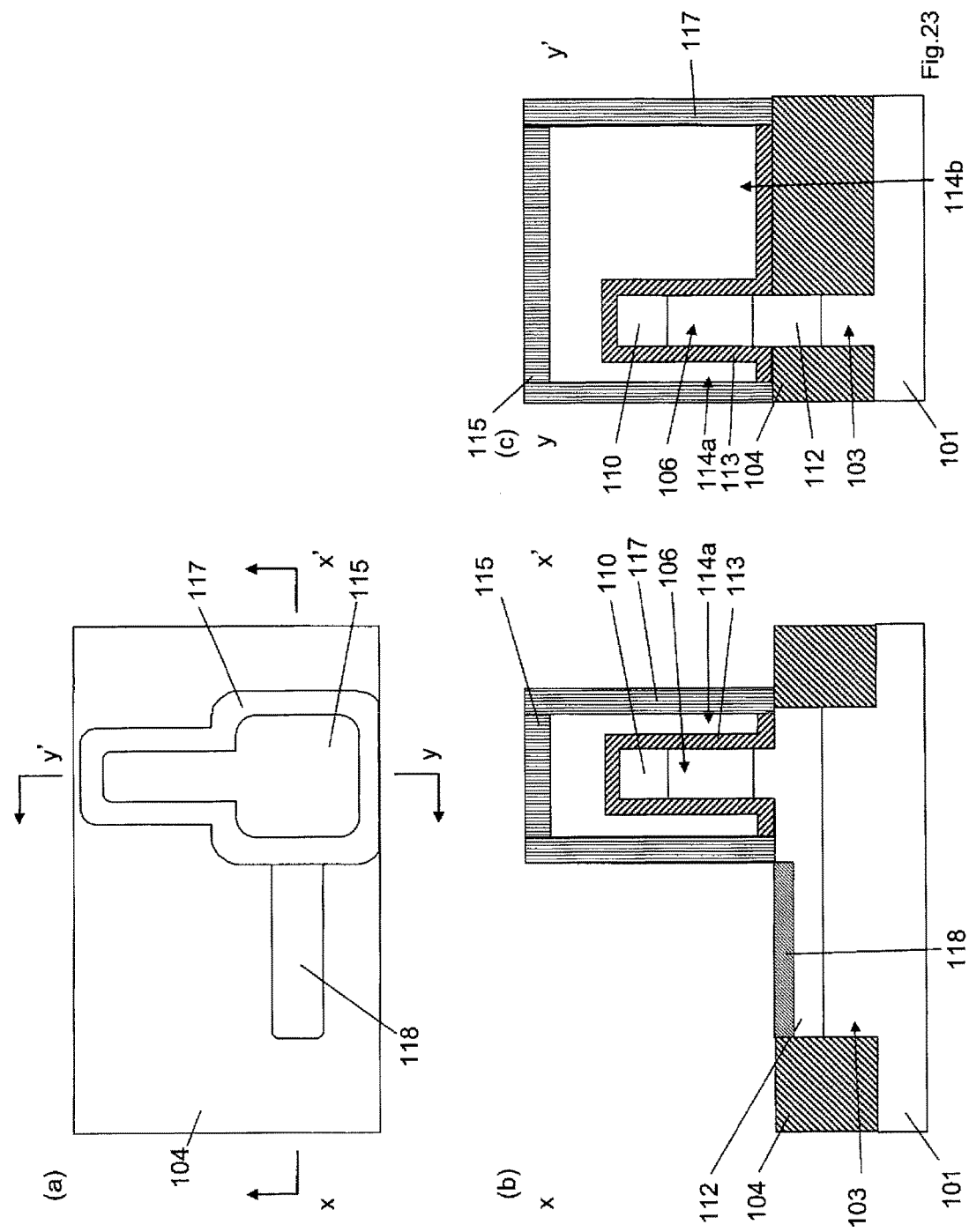
FIG. 23(a) is a plan view of a method for manufacturing a semiconductor device according to the present invention.
FIG. 23(b) is a sectional view taken along line X-X' in FIG. 23(a)
FIG. 23(c) is a sectional view taken along line Y-Y' in FIG. 23(a).

As shown in FIG. 23, a metal such as nickel or cobalt is deposited to form silicide 118 in an upper portion of the diffusion layer 112 formed in an upper portion of the fin-shaped silicon layer 103. At this time, the polysilicon gate electrode 114a and the polysilicon gate wiring 114b are covered with the third nitride film 117 and the second nitride film 115, and the diffusion layer 110 in an upper portion of the pillar-shaped silicon layer 106 is covered with the gate insulating film 113, the polysilicon gate electrode 114a, and the polysilicon gate wiring 114b, and thus silicide is not formed in the polysilicon gate electrode 114a, the polysilicon gate wiring 114b, and the diffusion layer 110.

The manufacturing method for forming a silicide in an upper portion of the fin-shaped silicon layer is described above.

Next, a gate-last manufacturing method is described, in which the polysilicon gate electrode and the polysilicon wiring are exposed by chemical mechanical polishing after an interlayer insulting film is deposited, the polysilicon gate electrode and the polysilicon wiring are etched, and then a metal is deposited.

As shown in FIG. 24, a fourth nitride film 140 is deposited for protecting the silicide 118.

Figure 25:
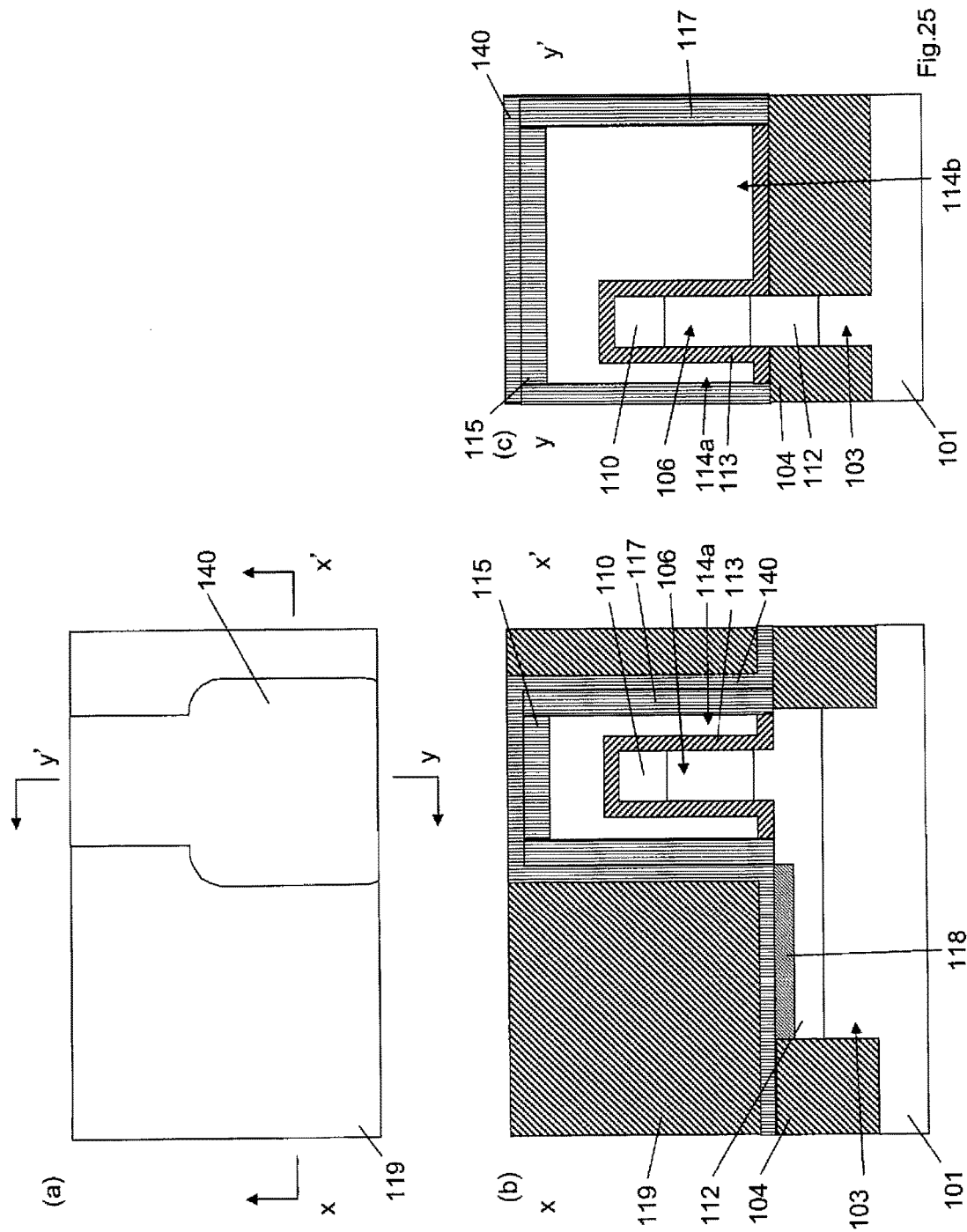
FIG. 25(a) is a plan view of a method for manufacturing a semiconductor device according to the present invention.
FIG. 25(b) is a sectional view taken along line X-X' in FIG. 25(a)
FIG. 25(c) is a sectional view taken along line Y-Y' in FIG. 25(a).

As shown in FIG. 25, an interlayer insulating film 119 is deposited and then planarized by chemical mechanical polishing.

As shown in FIG. 26, the polysilicon gate electrode 114a and the polysilicon gate wiring 114b are exposed by chemical mechanical polishing.

As shown in FIG. 27, the polysilicon gate electrode 114a and the polysilicon gate wiring 114b are etched. Wet etching is preferred.

As shown in FIG. 28, a metal 120 is deposited and then planarized to fill, with the metal 120, a portion from which the polysilicon gate electrode 114a and the polysilicon gate wiring 114b have been removed. Atomic layer deposition is preferably used.

As shown in FIG. 29, the metal 120 is etched to expose the gate insulating film 113 formed on the diffusion layer 110 in an upper portion of the pillar-shaped silicon layer 106. Consequently, a metal gate electrode 120a and a metal gate wiring 120b are formed. The gate-last manufacturing method is described above, in which after the interlayer insulating film is deposited, the polysilicon gate is exposed by chemical mechanical polishing, the polysilicon gate is etched, and then a metal is deposited.

Next, a manufacturing method for forming a contact is described. Since a silicide is not formed in the diffusion layer 110 in an upper portion of the pillar-shaped silicon layer 106, a contact is brought into direct contact with the diffusion layer 110 in an upper portion of the pillar-shaped silicon layer 106. As shown in FIG. 30, an interlayer insulating film 121 is deposited and then planarized.

Figure 31:
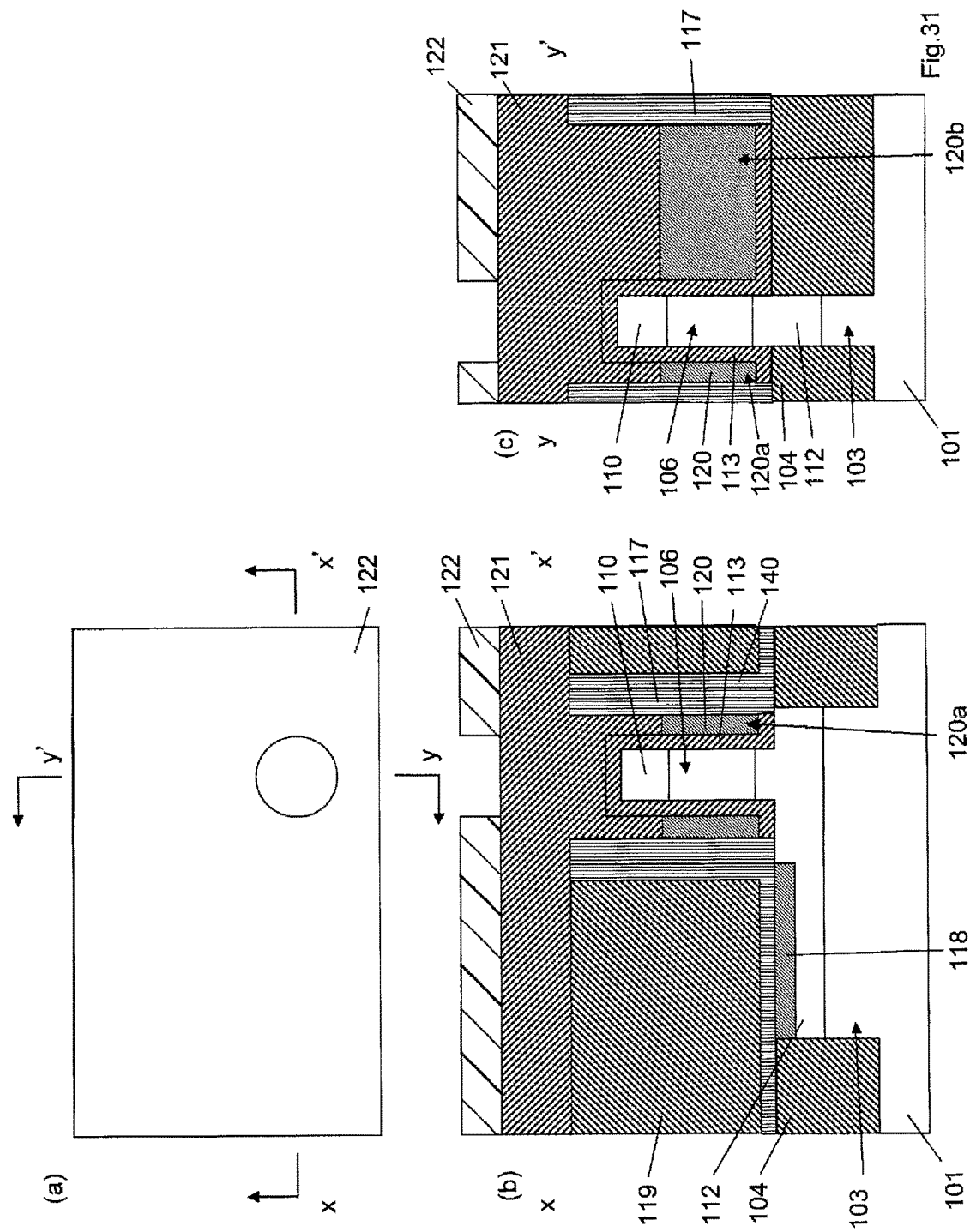
FIG. 31(a) is a plan view of a method for manufacturing a semiconductor device according to the present invention.
FIG. 31(b) is a sectional view taken along line X-X' in FIG. 31(a)
FIG. 31(c) is a sectional view taken along line Y-Y' in FIG. 31(a).

As shown in FIG. 31, a fourth resist 122 is formed for forming a contact hole on the pillar-shaped silicon layer 106.

Figure 32:
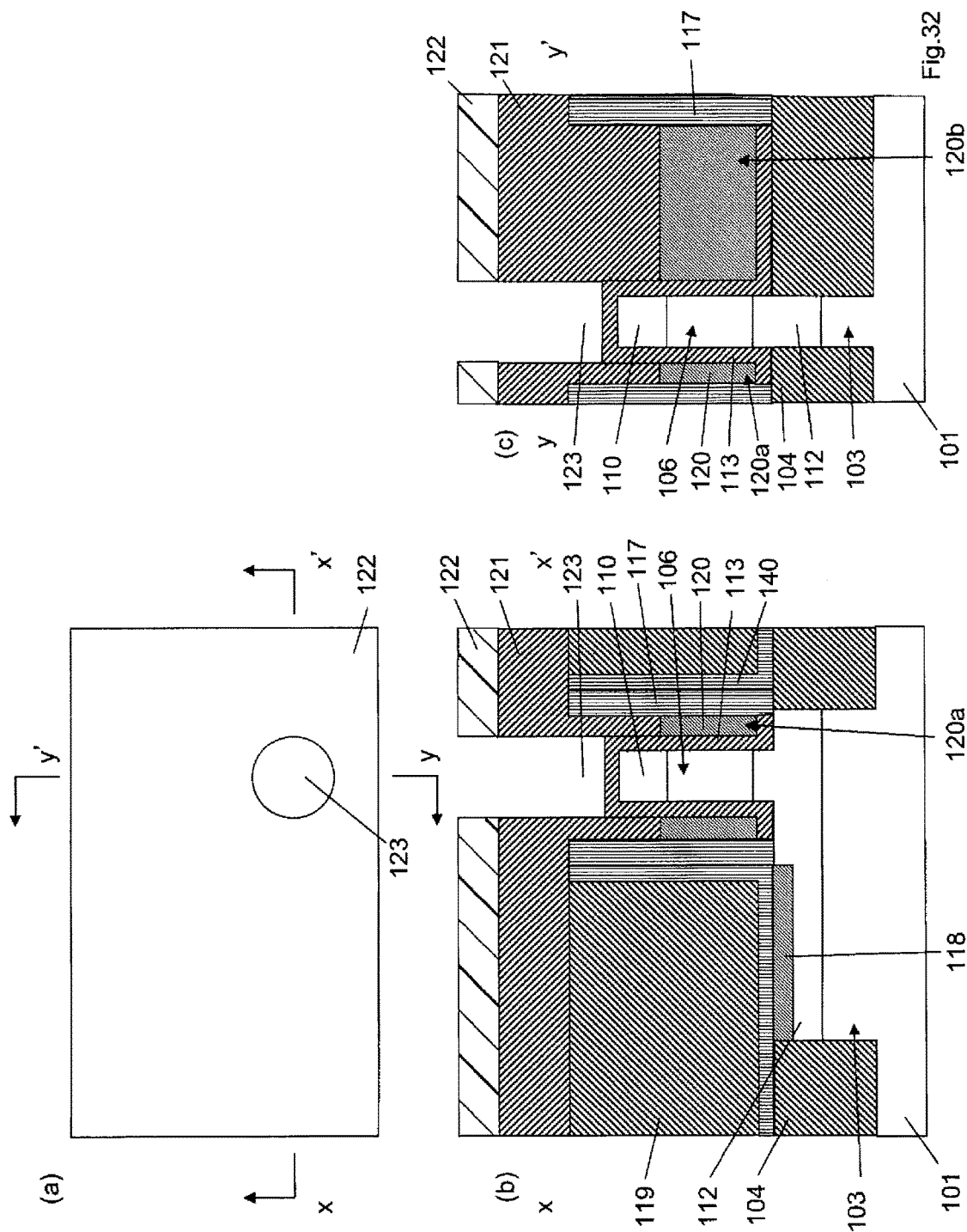
FIG. 32(a) is a plan view of a method for manufacturing a semiconductor device according to the present invention.
FIG. 32(b) is a sectional view taken along line X-X' in FIG. 32(a)
FIG. 32(c) is a sectional view taken along line Y-Y' in FIG. 32(a).

As shown in FIG. 32, the interlayer insulating film 121 is etched to form a contact hole 123.

As shown in FIG. 33, the fourth resist 122 is removed.

Figure 34:
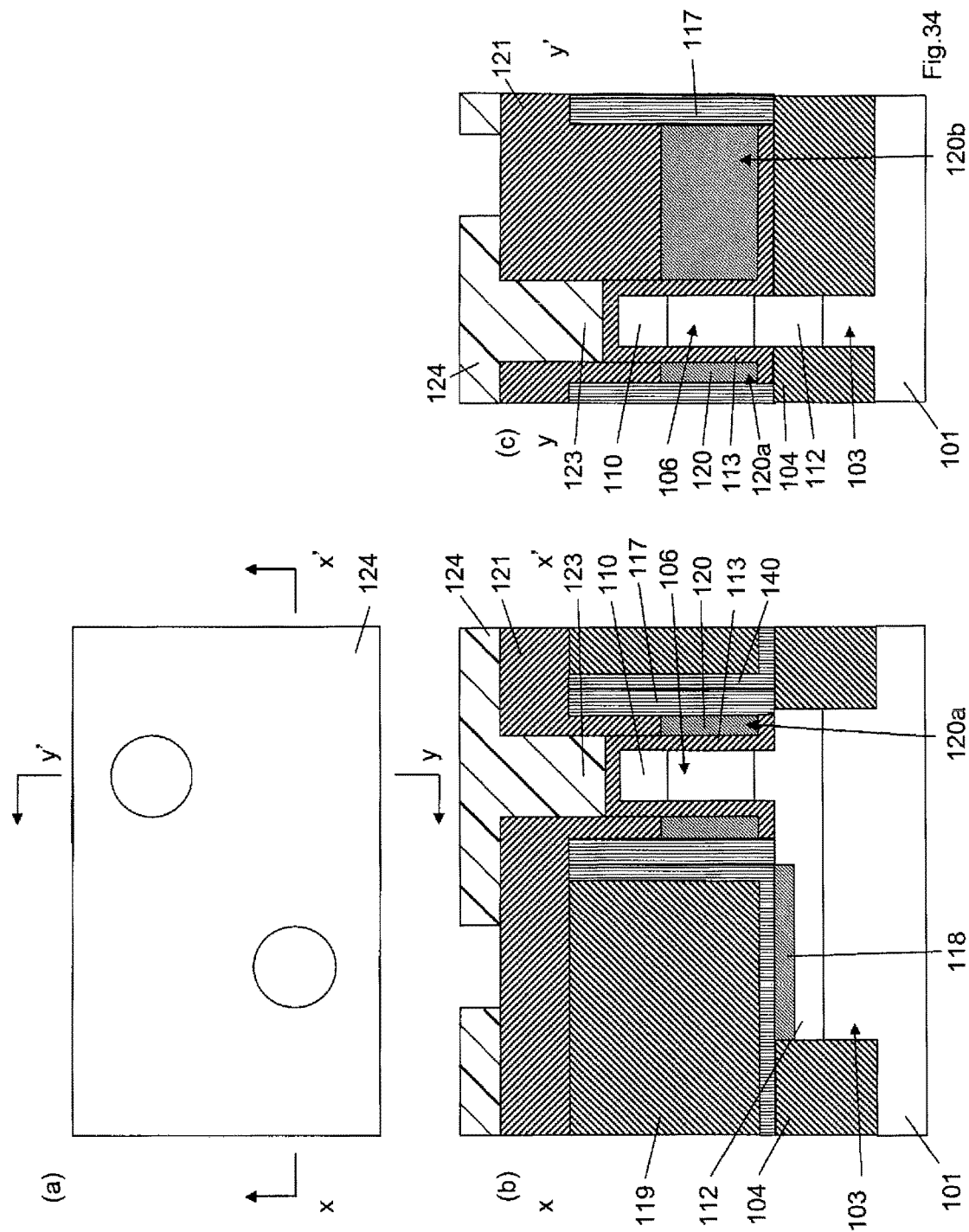
FIG. 34(a) is a plan view of a method for manufacturing a semiconductor device according to the present invention.
FIG. 34(b) is a sectional view taken along line X-X' in FIG. 34(a)
FIG. 34(c) is a sectional view taken along line Y-Y' in FIG. 34(a).

As shown in FIG. 34, a fifth resist 124 is formed for forming contact holes on the metal gate wiring 120b and on the fin-shaped silicon layer 103.

As shown in FIG. 35, the interlayer insulating films 121 and 119 are etched to form contact holes 125 and 126.

As shown in FIG. 36, the fifth resist 124 is removed.

As shown in FIG. 37, the nitride film 140 and the gate insulating film 113 is etched to expose the silicide 118 and the diffusion layer 110.

As shown in FIG. 38, a metal is deposited to form contacts 143, 127, and 128. The manufacturing method for forming contacts is described above. Since a silicide is not formed in the diffusion layer 110 in an upper portion of the pillar-shaped silicon layer 106, the contact 127 is brought into direct contact with the diffusion layer 110 in an upper portion of the pillar-shaped silicon layer 106.

Next, a manufacturing method for forming a metal wiring layer is described.

As shown in FIG. 39, a metal 129 is deposited.

As shown in FIG. 40, sixth resists 130, 131, and 132 are formed for forming the metal wiring.

Figure 41:
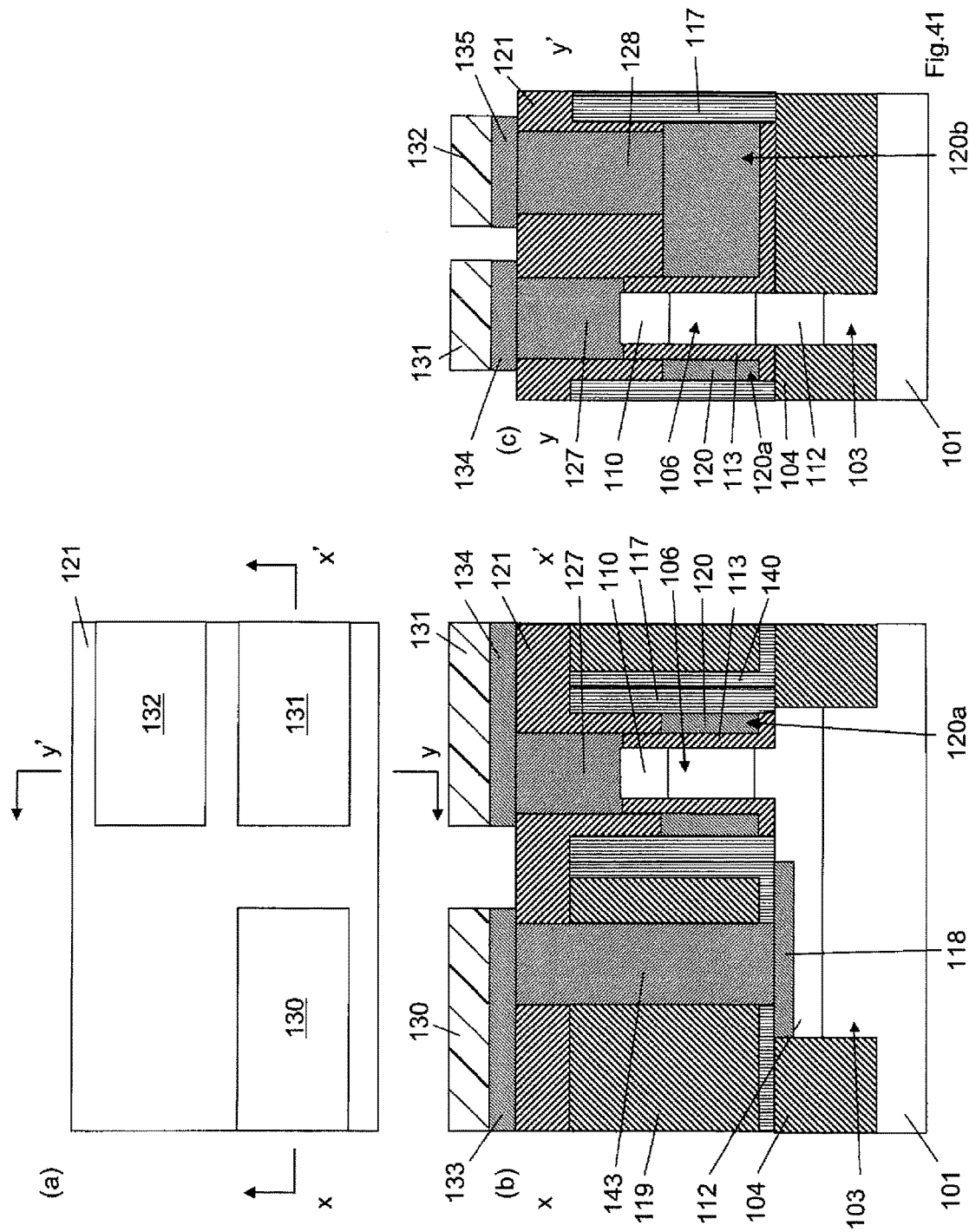
FIG. 41(a) is a plan view of a method for manufacturing a semiconductor device according to the present invention.
FIG. 41(b) is a sectional view taken along line X-X' in FIG. 41(a)
FIG. 41(c) is a sectional view taken along line Y-Y' in FIG. 41(a).

As shown in FIG. 41, the metal 129 is etched to metal wirings 133, 134, and 135.

As shown in FIG. 42, the sixth resists 130, 131, and 132 are removed.

The manufacturing method for forming metal wiring layers is described above.

Figure 1:
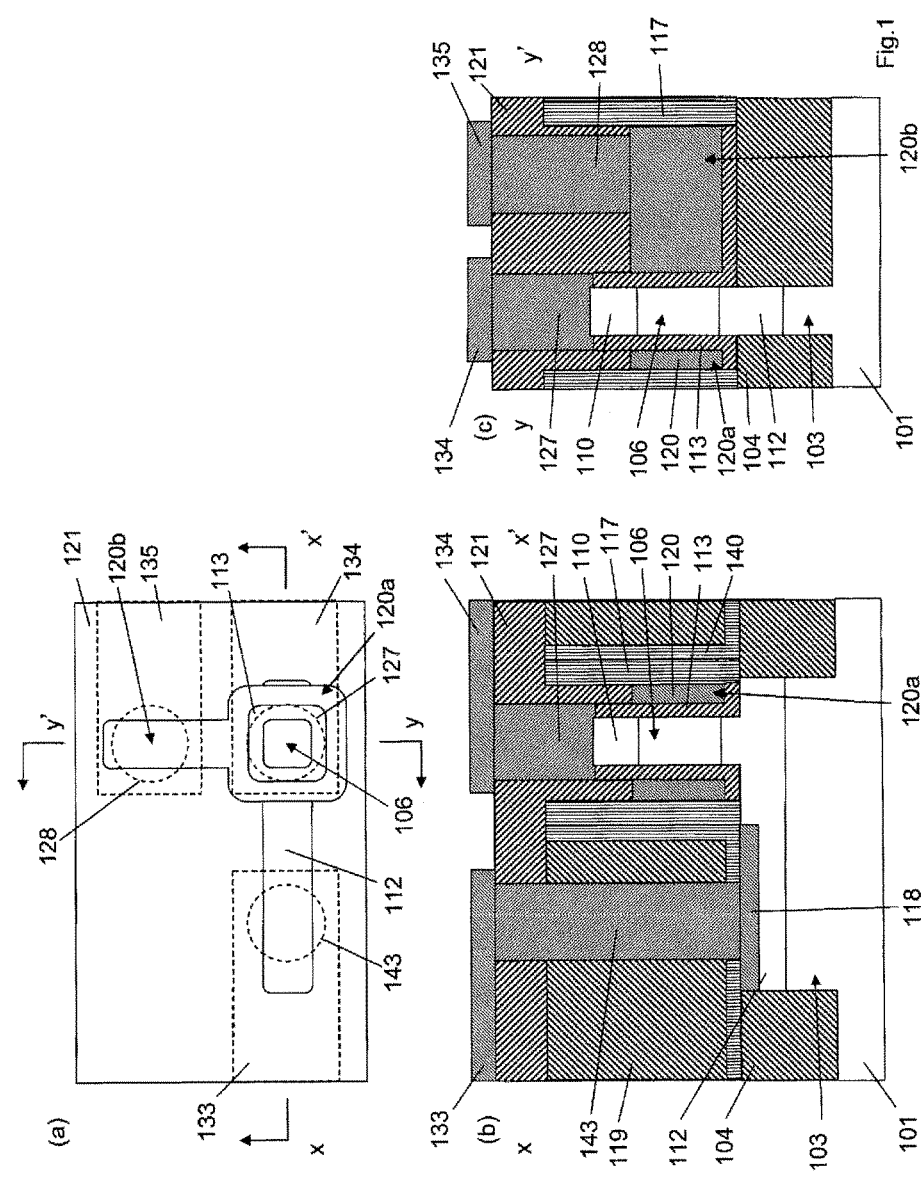
FIG. 1(a) is a plan view of a semiconductor device according to the present invention.
FIG. 1(b) is a sectional view taken along line X-X' in FIG. 1(a)
FIG. 1(c) is a sectional view taken along line Y-Y' in FIG. 1(a).

The result of the above-described manufacturing method is shown in FIG. 1.

The resulting structure includes: the fin-shaped silicon layer 103 formed on the substrate 101; the first insulating film 104 formed around the fin-shaped silicon layer 103; the pillar-shaped silicon layer 106 formed on the fin-shaped silicon layer 103, the width of the pillar-shaped silicon layer 106 being equal to the width of the fin-shaped silicon layer 103; the diffusion layer 112 formed in an upper portion of the fin-shaped silicon layer 103 and a lower portion of the pillar-shaped silicon layer 106; the diffusion layer 110 formed in an upper portion of the pillar-shaped silicon layer 106; the silicide 118 formed in an upper portion of the diffusion layer 112 in an upper portion of the fin-shaped silicon layer 103; the gate insulating film 113 formed around the pillar-shaped silicon layer 106; the metal gate electrode 120a formed around the gate insulating film; the metal gate wiring 120b connected to the metal gate electrode 120a and extending in a direction perpendicular to the fin-shaped silicon layer 103; and the contact 127 formed on the diffusion layer 110, the diffusion layer 110 and the contact 127 being in direct contact with each other.

As described above, it is possible to decrease a parasitic capacitance between a gate wiring and a substrate and provide a SGT manufacturing method using a gate-last process and a resulting SGT structure.

What is claimed is:

1. A semiconductor device comprising:
   a fin-shaped silicon layer on a surface of a silicon substrate, the fin-shaped silicon layer having a longitudinal axis extending in a first direction parallel to the surface;
   a first insulating film around the fin-shaped silicon layer;
   a pillar-shaped silicon layer on the fin-shaped silicon layer, a pillar diameter of the pillar-shaped silicon layer being equal to a fin width of the fin-shaped silicon layer, the pillar diameter and the fin width parallel to the surface;
   a first diffusion layer in an upper portion of the fin-shaped silicon layer and a lower portion of the pillar-shaped silicon layer;
   a second diffusion layer in an upper portion of the pillar-shaped silicon layer;
   a silicide in an upper portion of the first diffusion layer in the upper portion of the fin-shaped silicon layer;
   a gate insulating film around the pillar-shaped silicon layer;
   a metal gate electrode around the gate insulating film;
   a metal gate wiring connected to the metal gate electrode, the metal gate wiring having a longitudinal axis extending in a second direction parallel to the surface and perpendicular to the first direction of the longitudinal axis of the fin-shaped silicon layer; and
   a contact on the second diffusion layer in the upper portion of the pillar-shaped silicon layer so as to make direct contact with the second diffusion layer.

2. The semiconductor device of claim 1, wherein the gate insulating film separates the metal gate electrode from the first diffusion layer in the upper portion of the fin-shaped silicon layer.

3. The semiconductor device of claim 2, wherein the gate insulating film contacts the first insulating film and separates the metal gate wiring from the first insulating film.

4. The semiconductor device of claim 1, wherein an upper surface of the first insulating film is on a same lateral plane with an upper surface of the first diffusion layer in the upper portion of the fin-shaped silicon layer, the lateral plane parallel to the surface.

* * * * *